US011854902B2

(12) United States Patent
Chiang et al.

(10) Patent No.: US 11,854,902 B2
(45) Date of Patent: *Dec. 26, 2023

(54) INTEGRATED CIRCUITS WITH BURIED INTERCONNECT CONDUCTORS

(71) Applicant: Taiwan Semiconductor Manufacturing Co., Ltd., Hsinchu (TW)

(72) Inventors: Kuo-Cheng Chiang, Hsinchu County (TW); Shi Ning Ju, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/869,132

(22) Filed: Jul. 20, 2022

(65) Prior Publication Data
US 2022/0359305 A1    Nov. 10, 2022

Related U.S. Application Data

(60) Continuation of application No. 17/306,633, filed on May 3, 2021, now Pat. No. 11,456,217, which is a (Continued)

(51) Int. Cl.
*H01L 21/8234* (2006.01)
*H01L 29/78* (2006.01)
(Continued)

(52) U.S. Cl.
CPC ........... *H01L 21/823475* (2013.01); *H01L 21/76832* (2013.01); *H01L 21/76876* (2013.01);
(Continued)

(58) Field of Classification Search
CPC ....... H01L 21/823475; H01L 21/76832; H01L 21/76876; H01L 21/823431;
(Continued)

(56) References Cited

U.S. PATENT DOCUMENTS 8,772,109 B2   7/2014  Colinge
8,785,285 B2   7/2014  Tsai et al.
(Continued)

FOREIGN PATENT DOCUMENTS

CN    105990346 B    10/2016
CN    106981487 A     7/2017
KR    20170042938 A   4/2017

OTHER PUBLICATIONS

Bardon, M. Garcia et al., "Extreme Scaling enabled by 5 Tracks Cells : Holistic design-device co-optimization for FinFETs and Lateral Nanowires", 2016 IEEE International Electron Devices Meeting (IEDM), San Francisco, CA, Dec. 3-7, 2016, 4 pages.

*Primary Examiner* — Calvin Y Choi
(74) *Attorney, Agent, or Firm* — HAYNES AND BOONE, LLP

(57) ABSTRACT

Examples of an integrated circuit with an interconnect structure that includes a buried interconnect conductor and a method for forming the integrated circuit are provided herein. In some examples, the method includes receiving a substrate that includes a plurality of fins extending from a remainder of the substrate. A spacer layer is formed between the plurality of fins, and a buried interconnect conductor is formed on the spacer layer between the plurality of fins. A set of capping layers is formed on the buried interconnect conductor between the plurality of fins. A contact recess is etched through the set of capping layers that exposes the buried interconnect conductor, and a contact is formed in the contact recess that is electrically coupled to the buried interconnect conductor.

20 Claims, 17 Drawing Sheets

Related U.S. Application Data division of application No. 16/288,636, filed on Feb. 28, 2019, now Pat. No. 10,998,238.

(60) Provisional application No. 62/753,756, filed on Oct. 31, 2018.

(51) Int. Cl.
*H01L 29/66* (2006.01)
*H01L 21/768* (2006.01)
*H01L 27/088* (2006.01)

(52) U.S. Cl.
CPC ........ *H01L 21/823431* (2013.01); *H01L 21/823437* (2013.01); *H01L 21/823468* (2013.01); *H01L 27/0886* (2013.01); *H01L 29/66545* (2013.01); *H01L 29/66795* (2013.01); *H01L 29/785* (2013.01); *H01L 2029/7858* (2013.01)

(58) Field of Classification Search
CPC ..... H01L 21/823437; H01L 21/823468; H01L 21/823821; H01L 21/845; H01L 27/0886; H01L 27/0924; H01L 27/1211; H01L 29/41791; H01L 29/66545; H01L 29/66795; H01L 29/785; H01L 29/7851; H01L 29/7853; H01L 29/7854; H10B 12/056; H10B 12/36

USPC ....................................................... 257/368
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,570,395 B1 | 2/2017 | Sengupta et al. |
| 9,576,814 B2 | 2/2017 | Wu et al. |
| 10,192,819 B1 | 1/2019 | Chanemougame et al. |
| 10,998,238 B2* | 5/2021 | Ching ............... H01L 21/76897 |
| 11,456,217 B2* | 9/2022 | Chiang ............... H01L 27/0886 |
| 2009/0057765 A1* | 3/2009 | Zhu ....................... H01L 21/845 |
| | | 257/E21.409 |
| 2015/0099344 A1 | 4/2015 | Kim |
| 2016/0148832 A1* | 5/2016 | Leobandung ....... H01L 29/6656 |
| | | 438/283 |
| 2016/0329414 A1* | 11/2016 | Lee .................... H01L 29/0847 |
| 2017/0062421 A1 | 3/2017 | Cosemans |
| 2017/0352625 A1 | 12/2017 | Leobandung |
| 2018/0254246 A1* | 9/2018 | Park .................. H01L 23/53209 |
| 2018/0254327 A1 | 9/2018 | Zang |
| 2020/0027959 A1* | 1/2020 | Cheng .................... B82Y 10/00 |

* cited by examiner

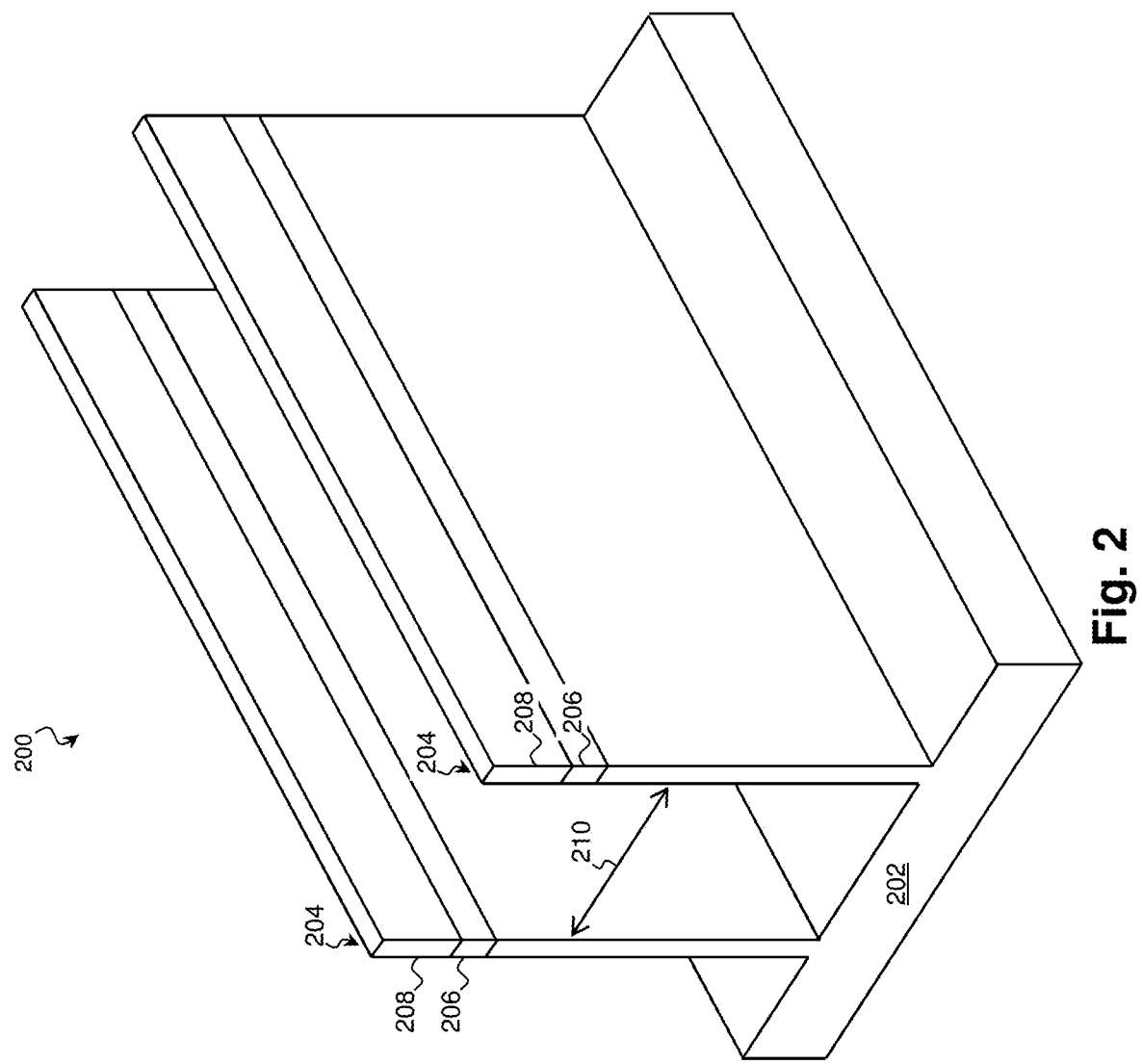

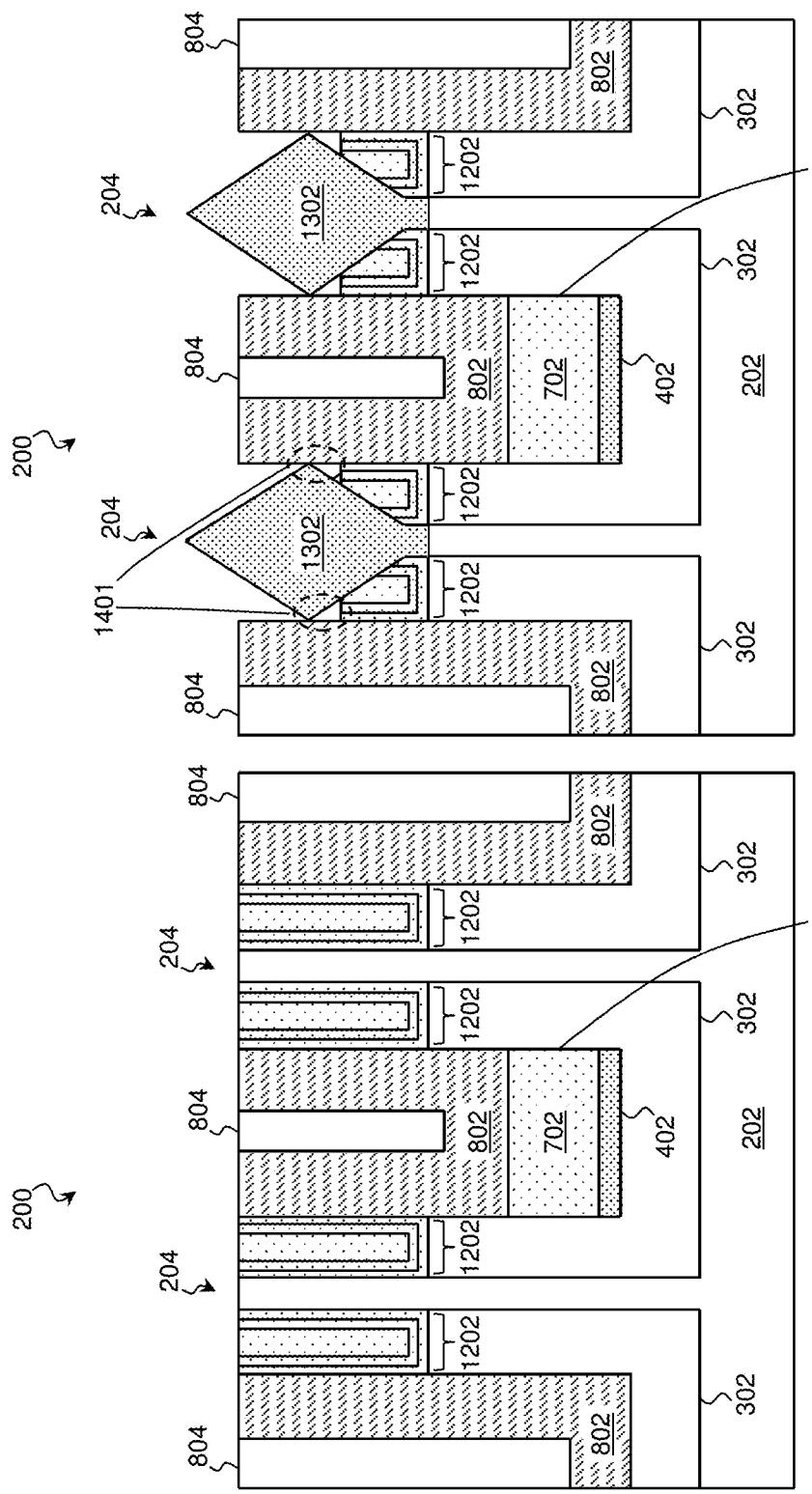

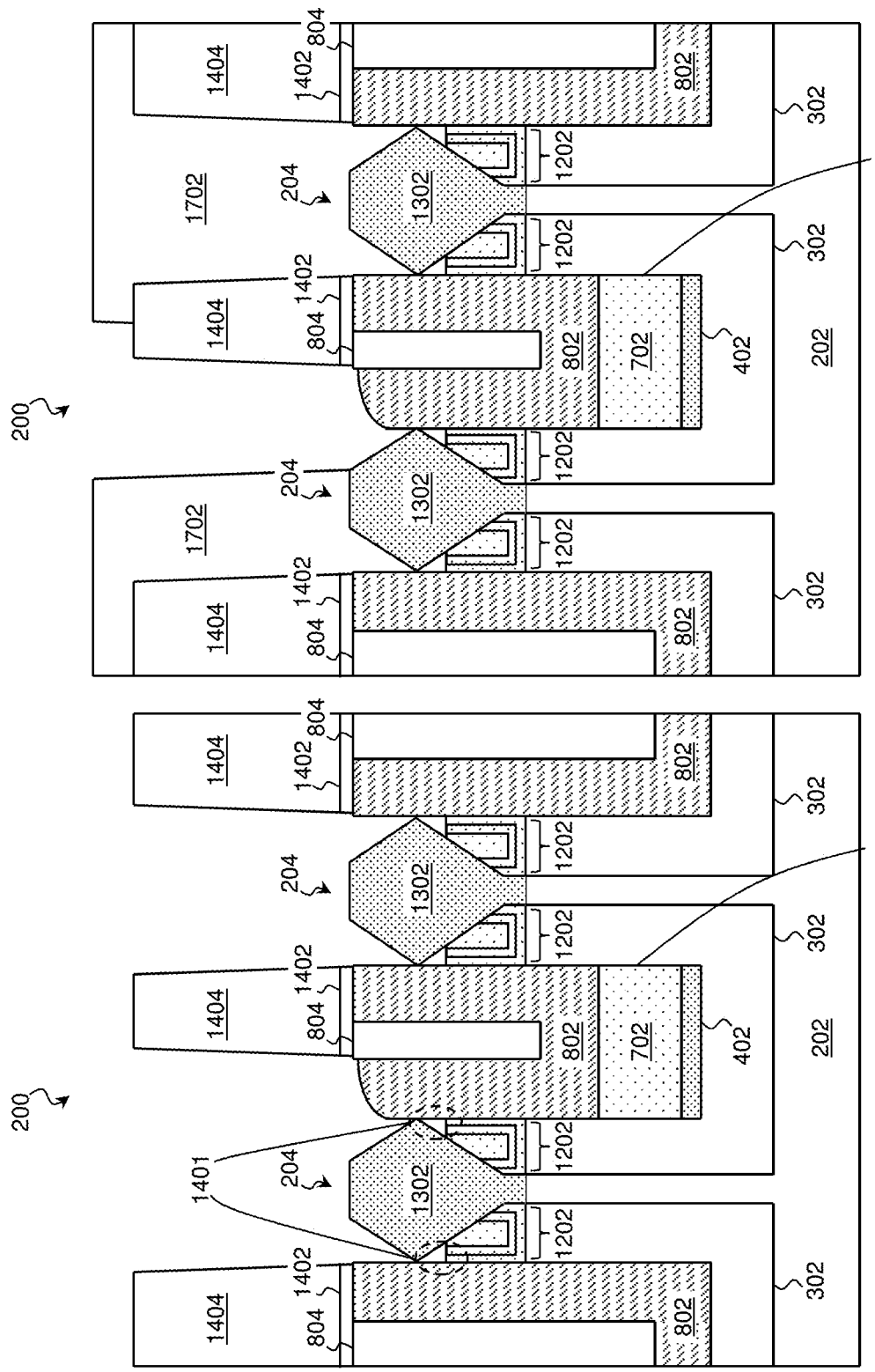

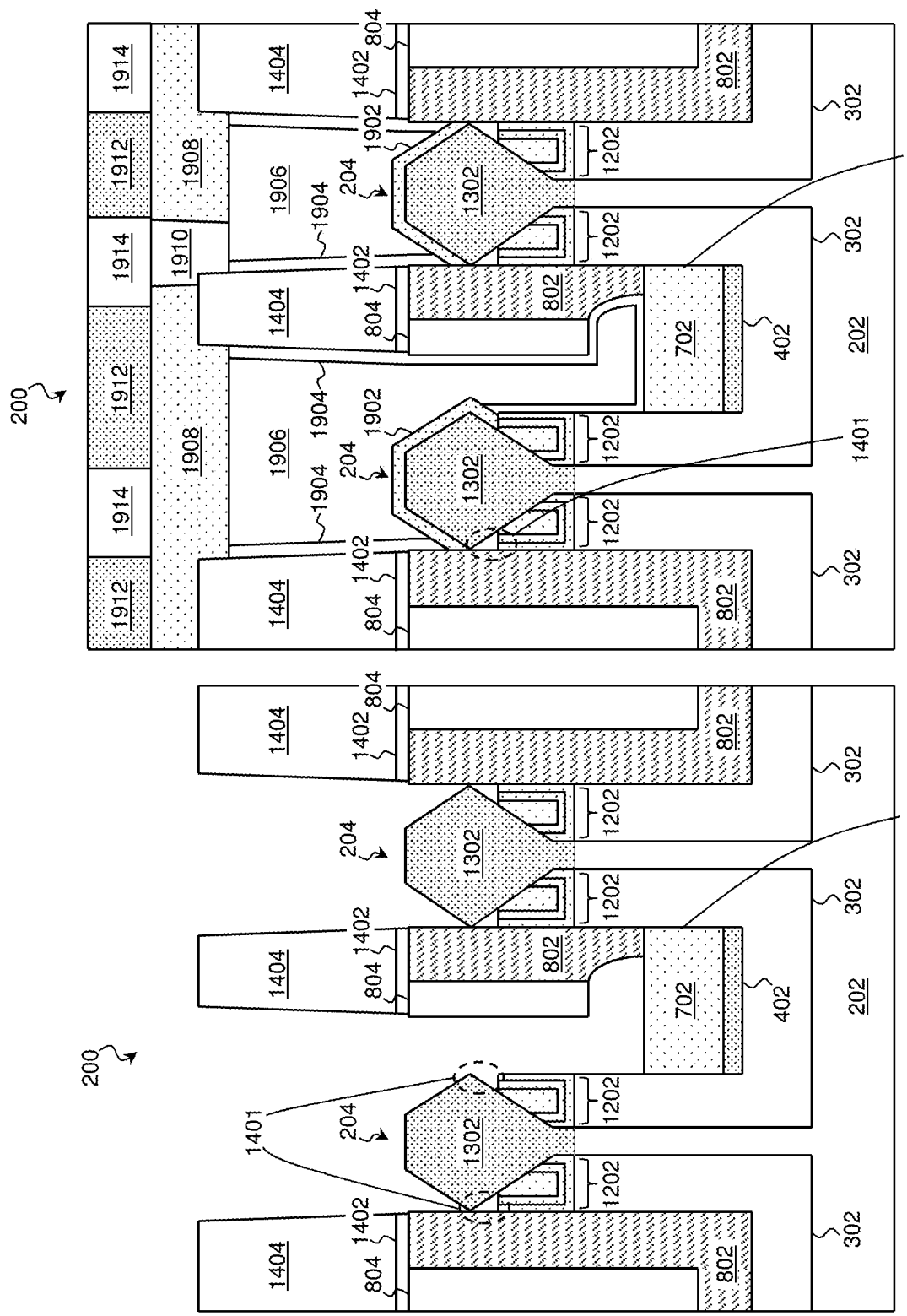

INTEGRATED CIRCUITS WITH BURIED INTERCONNECT CONDUCTORS

PRIORITY DATA

This application is a continuation of U.S. patent application Ser. No. 17/306,633, filed May 3, 2021, which is a divisional application of U.S. patent application Ser. No. 16/288,636, filed Feb. 28, 2019, which claims the benefit of U.S. Provisional Application No. 62/753,756, entitled "Semiconductor Device and Methods of Forming Same," filed Oct. 31, 2018, each of which is incorporated by reference in its entirety.

BACKGROUND

The semiconductor industry has progressed into nanometer technology process nodes in pursuit of higher device density, higher performance, and lower cost. Beyond merely shrinking devices, circuit designers are looking to novel structures to deliver even greater performance. One avenue of inquiry is the development of three-dimensional designs, such as a fin-like field effect transistor (FinFET). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

To electrically couple the FinFETs and other devices, an integrated circuit may include an interconnect structure with one or more layers of conductive lines electrically coupled to the devices. The overall circuit size and performance may depend on the number and size of the conductive lines as well as the circuit devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-11 are perspective illustrations of a workpiece undergoing a method of fabrication according to various aspects of the present disclosure.

FIGS. 12-14 are cross-sectional illustrations of a workpiece taken through a source/drain region according to various aspects of the present disclosure.

FIGS. 16-19 are cross-sectional illustrations of a workpiece taken through a source/drain region according to various aspects of the present disclosure.

DETAILED DESCRIPTION

Figure 1A:
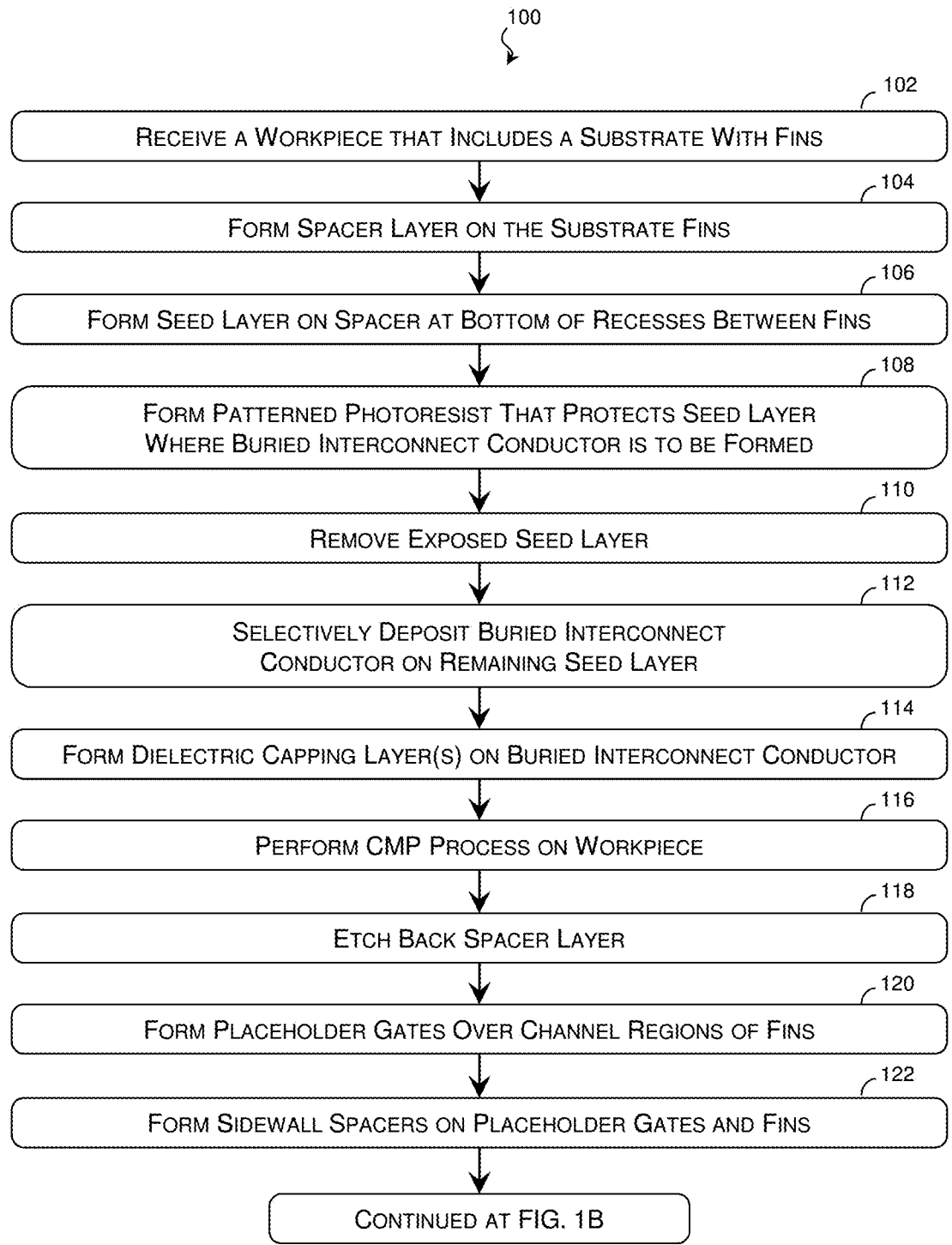
FIGS. 1A and 1B are flow diagrams of a method of fabricating an integrated circuit workpiece with buried conductive lines according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Advances in fabrication have reduced the sizes of transistors and other active devices that make up an integrated circuit, and as the device sizes are reduced, the corresponding integrated circuits may become wire-bound. In other words, the circuit size may depend on the conductive lines in an interconnect structure that electrically couples the circuit devices rather than on the sizes of the devices themselves. While the thickness of the conductive lines may be reduced to pack more lines in the interconnect, thinner lines have a higher resistance, making them slower and more of a load on the driving device. Likewise, reducing the spacing between lines increases the risk of shorts, noise interference, and capacitive coupling, which may increase the load on the driver. Additional layers of conductive lines may be added to the interconnect structure, but routing on these layers may take additional vias, which have an associated resistance and pose inter-layer alignment issues. Alignment errors tend to compound with each additional interconnect layer, adding yield risk as the number of layers grows.

As described below, the present disclosure provides a technique to relieve some interconnect congestion by providing conductive lines below the interconnect (e.g., the conductive lines and vias above the circuit devices and the contacts that couple to the devices). For example, in a FinFET circuit, interconnect lines may be formed below the transistor portions of the fins. These lines may be used to carry signals between devices or provide power and/or ground rails. In some examples, the buried conductors act as buried power rails (BPRs) that are electrically coupled, through one or more source/drain contacts, to metal layers or interconnect lines overlying the FinFET circuit. In these examples and others, the buried interconnect lines provide additional routing resources (in addition to the metal layers or interconnect lines overlying the FinFET circuit), which may be used to reduce the circuit area, increase circuit density, relieve routing congestion, and/or decrease routing density in the remainder of the interconnect.

Some examples of the present disclosure also provide a self-aligned process for forming the buried conductors that uses a spacer layer to separate the buried conductors from adjacent structures such as the fins. The spacer layer may greatly reduce the amount of overlay precision required when forming the buried conductors and when forming contacts to the buried conductors. Some examples also provide a bi-layer dielectric on top of the buried conductors. The structure and the materials of the bi-layer dielectric may be used to create a unique contact shape with a relatively large interface with the buried conductor for low resistance without inadvertent shorting.

Thus, some embodiments of the present disclosure include conductive lines disposed below the interconnect that provide additional routing resources. However, unless otherwise noted, no embodiment is required to provide any particular advantage.

Figure 1B:
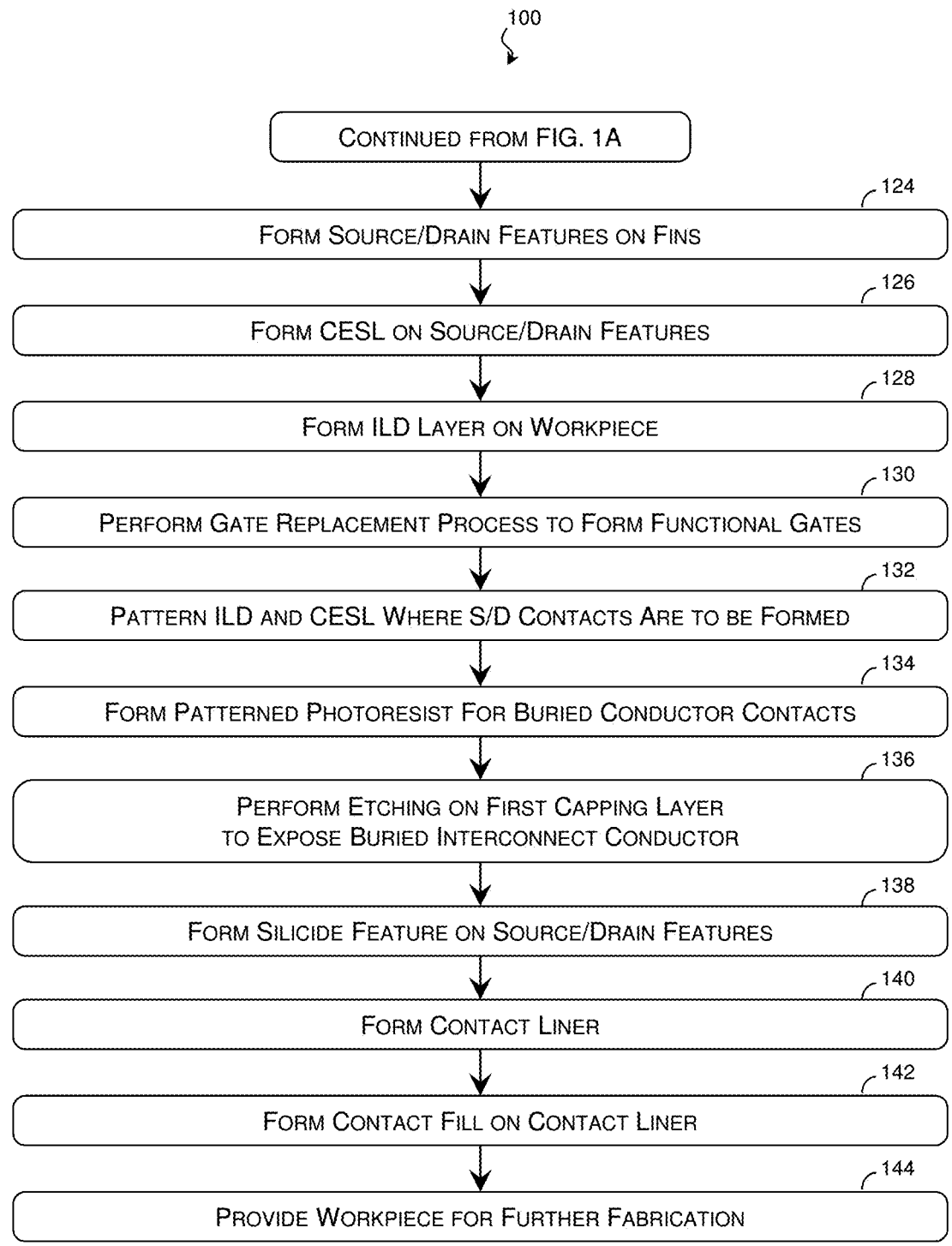
Figure 15:
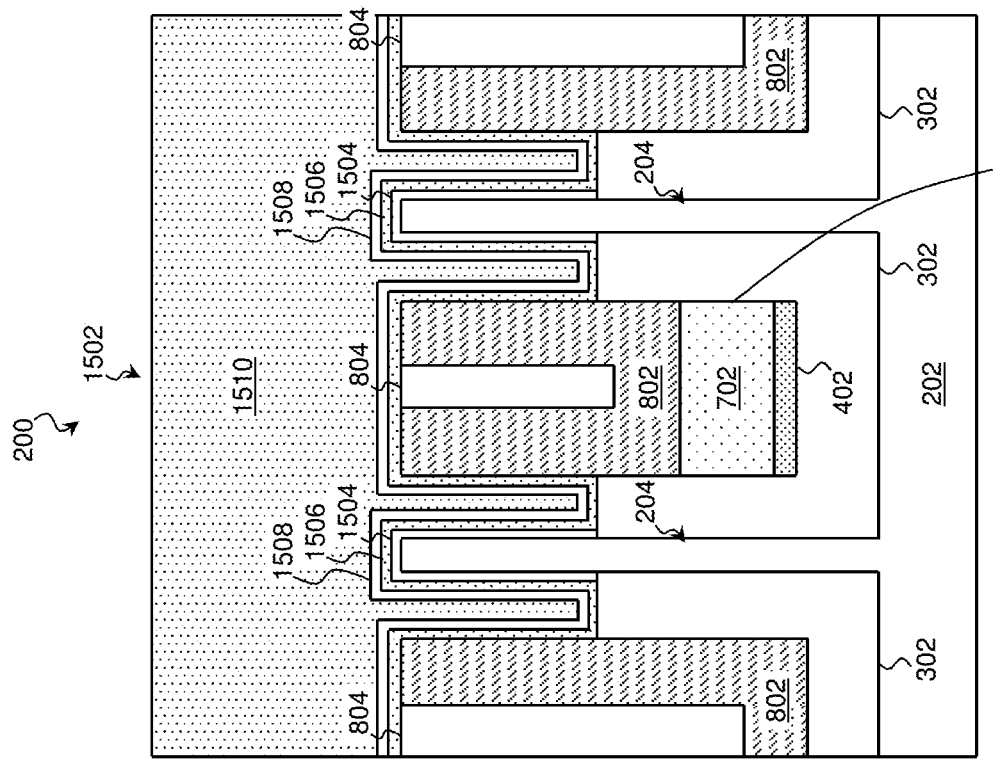
FIG. 15 is a cross-sectional illustration of the workpiece taken through a gate region according to various aspects of the present disclosure.

Examples of an integrated circuit including a buried conductive line and a technique for forming the conductive line are described with reference to FIGS. 1A-19. In that regard, FIGS. 1A and 1B are flow diagrams of a method 100 of fabricating an integrated circuit workpiece 200 with buried conductive lines according to various aspects of the present disclosure. Additional steps can be provided before, during, and after the method 100, and some of the steps described can be replaced or eliminated for other embodiments of the method 100. FIGS. 2-11 are perspective illustrations of the workpiece 200 undergoing the method 100 of fabrication according to various aspects of the present disclosure. FIGS. 12-14 and 16-19 are cross-sectional illustrations of the workpiece 200 taken through a source/drain region according to various aspects of the present disclosure. FIG. 15 is a cross-sectional illustration of the workpiece 200 taken through a gate region according to various aspects of the present disclosure.

Referring to block 102 of FIG. 1A and to FIG. 2, the workpiece 200 is received. The workpiece 200 includes a substrate 202 upon which devices are to be formed. In various examples, the substrate 202 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 202 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 202. In some such examples, a layer of the substrate 202 may include an insulator such as a semiconductor oxide, a semiconductor nitride, a semiconductor oxynitride, a semiconductor carbide, and/or other suitable insulator materials.

Doped regions, such as wells, may be formed on the substrate 202. In that regard, some portions of the substrate 202 may be doped with p-type dopants, such as boron, $BF_2$, or indium while other portions of the substrate 202 may be doped with n-type dopants, such as phosphorus or arsenic; and/or other suitable dopants including combinations thereof.

In some examples, the devices to be formed on the substrate 202 extend out of the substrate 202. For example, FinFETs and/or other non-planar devices may be formed on device fins 204 disposed on the substrate 202. The device fins 204 are representative of any raised feature and include FinFET device fins 204 as well as fins 204 for forming other raised active and passive devices upon the substrate 202. The fins 204 may be similar in composition to the substrate 202 or may be different therefrom. For example, in some embodiments, the substrate 202 may include primarily silicon, while the fins 204 include one or more layers that are primarily germanium or a SiGe semiconductor. In some embodiments, the substrate 202 includes a SiGe semiconductor, and the fins 204 include one or more layers that include a SiGe semiconductor with a different ratio of silicon to germanium than the substrate 202.

The fins 204 may be formed by etching portions of the substrate 202, by depositing various layers on the substrate 202 and etching the layers, and/or by other suitable techniques. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 204 and one or more fin-top hard masks (e.g., fin-top hard masks 206 and 208). The sacrificial layer is patterned using a photolithography process. Spacers are formed alongside the patterned sacrificial layer using a self-aligned process. The sacrificial layer is then removed, and the remaining spacers are used to pattern the fins 204 by removing material of the fin-top hard masks 206 and 208 and the fins 204 that is not covered by the spacers.

The fin-top hard masks 206 and 208 may be used to control the etching process that defines the fins 204 and may protect the fins 204 during subsequent processing. Accordingly, the fin-top hard masks 206 and 208 may be selected to have different etch selectivity from the material(s) of the fins 204 and from each other. The fin-top hard masks 206 and 208 may include dielectric materials such as semiconductor oxides, semiconductor nitrides, semiconductor oxynitrides, semiconductor carbides, semiconductor carbonitrides, semiconductor oxycarbonitrides, and/or metal oxides.

The patterning and etching process may leave gaps of any width between the fins 204. Because the present technique may be used to selectively form buried interconnect conductors between some fins 204, gaps where buried conductors are to be formed may be more than a minimum fin-to-fin spacing apart to leave room for the conductors. In some examples, a gap where a buried interconnect is to be formed has a width (indicated by marker 210) between about 2 times and about 10 times the minimum fin-to-fin spacing. In some such examples where the fin width is between about 5 nm and about 10 nm and the minimum fin-to-fin spacing is between about 10 nm and about 40 nm, the gap width 210 where a buried interconnect is to be formed is between about 30 nm and about 80 nm.

Figure 3:
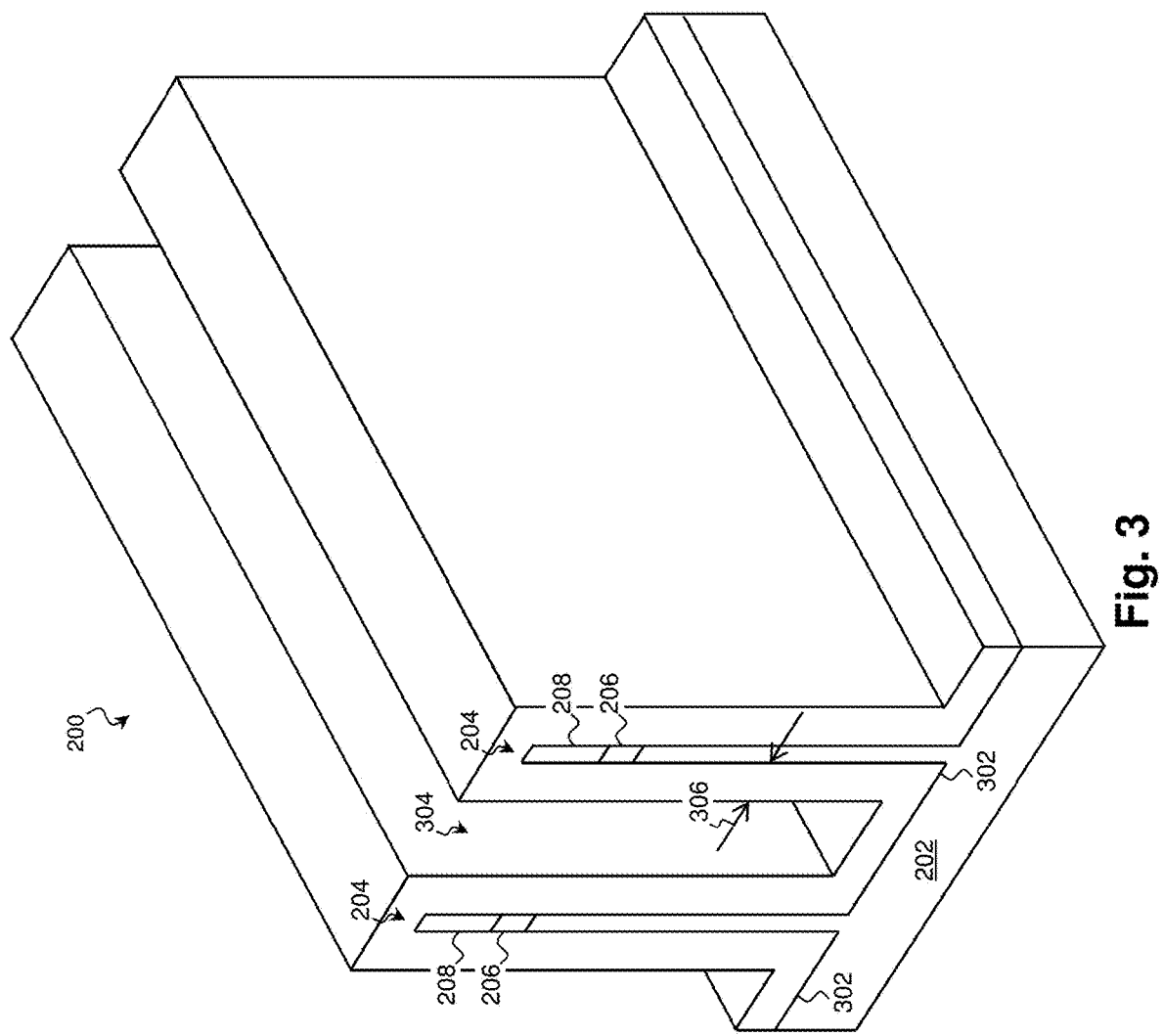

Referring to block 104 of FIG. 1A and to FIG. 3, a dielectric spacer layer 302 is formed on the substrate 202, the fins 204, and the fin-top hard masks 206 and 208. The spacer layer 302 may be structured to fill the recesses between those fins 204 that are a minimum spacing apart and to define trenches 304 for forming interconnect conductors between those fins 204 that are more than the minimum spacing apart. To do so, the spacer layer 302 may be formed using a substantially conformal technique to have a thickness 306 that is at least half of the minimum spacing between fins 204 so that a first portion on a sidewall of a first fin 204 merges with a second portion on a sidewall of an adjacent second fin 204 if the fins 204 are the minimum spacing apart. In various such examples, this represents a thickness 306 between about 5 nm and about 20 nm.

The spacer layer 302 may be formed by any suitable process, and in some examples, the spacer layer 302 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. The spacer layer 302 may include a dielectric material such as a semiconductor oxide, a semiconductor nitride, a semiconductor oxynitride, a semiconductor carbide, a semiconductor carbonitride, a semiconductor oxycarbonitride, a metal oxide, etc., and in some examples, the spacer layer 302 includes silicon oxide.

Figure 4:
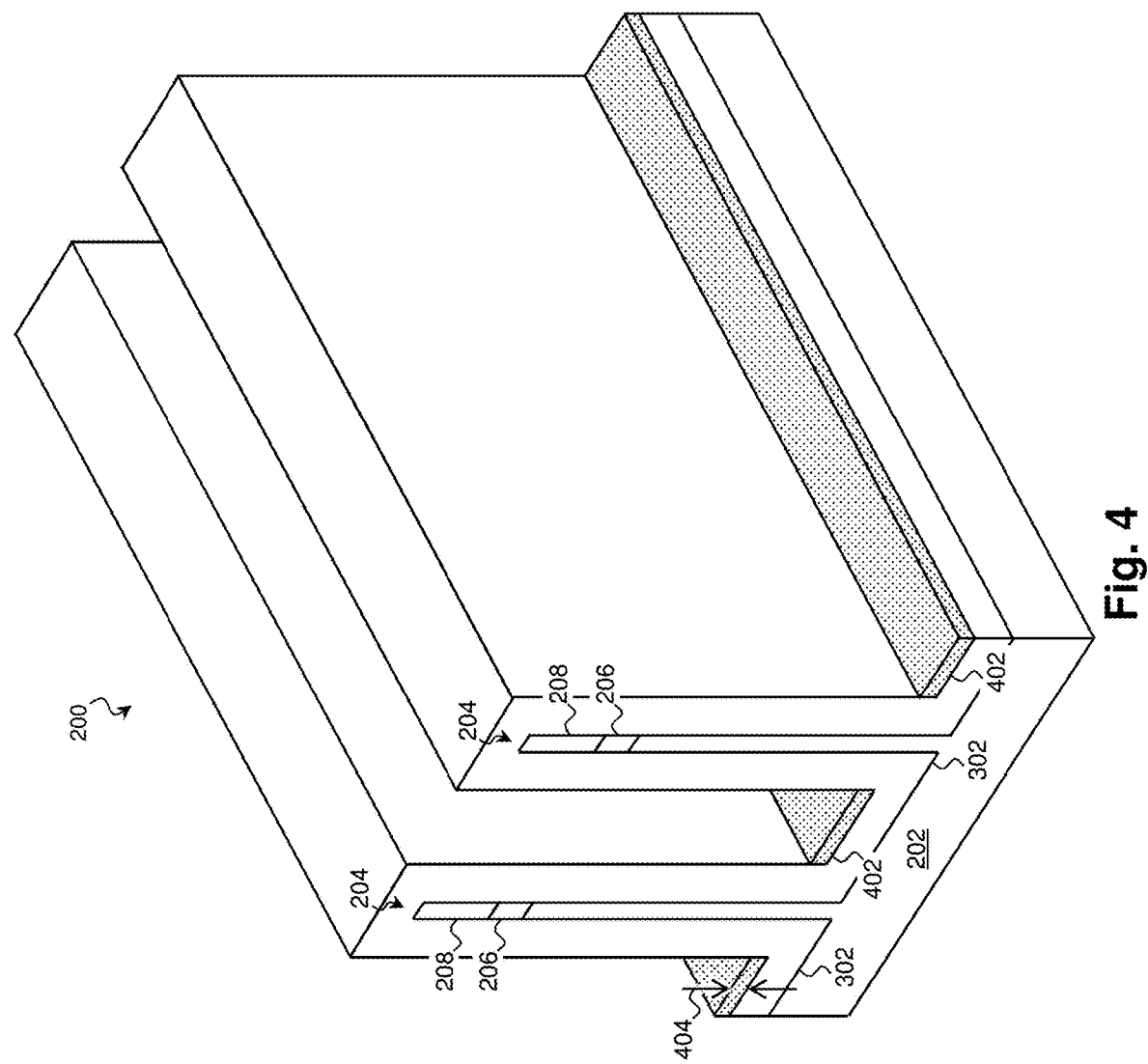

Referring to block 106 of FIG. 1A and to FIG. 4, a seed layer 402 is formed on the spacer layer 302 between the fins 204. The seed layer 402 may be configured to promote the selective deposition of materials of the conductive line, and may include amorphous silicon, other semiconductor materials, dielectric materials, conductors, and/or other suitable materials.

The seed layer 402 may be selectively formed on the horizontal surfaces of the spacer layer 302 without substantial deposition on the vertical surfaces. Thus, the seed layer is deposited on at least the bottommost surface of the spacer layer 302 between the fins 204. In some examples, this is done by depositing the seed layer 402 on both horizontal and vertical surfaces using a conformal deposition technique (e.g., ALD, PEALD, CVD, PECVD, HDP-CVD, and/or other suitable deposition techniques) and performing an etching process to remove the dielectric spacer from the vertical surfaces of the spacer layer 302. Suitable etching processes includes dry etching processes (e.g., reactive ion etching and/or other plasma etching). Additionally or in the alternative, the seed layer 402 may be selectively formed on the only horizontal surfaces of the spacer layer 302 by using a deposition technique with low-step coverage, such as Physical Vapor Deposition (PVD).

The deposition and/or etching may be configured to produce a seed layer 402 with any suitable thickness 404, and in some examples, the thickness 404 of the seed layer 402 is between about 5 nm and about 10 nm.

Figure 5:
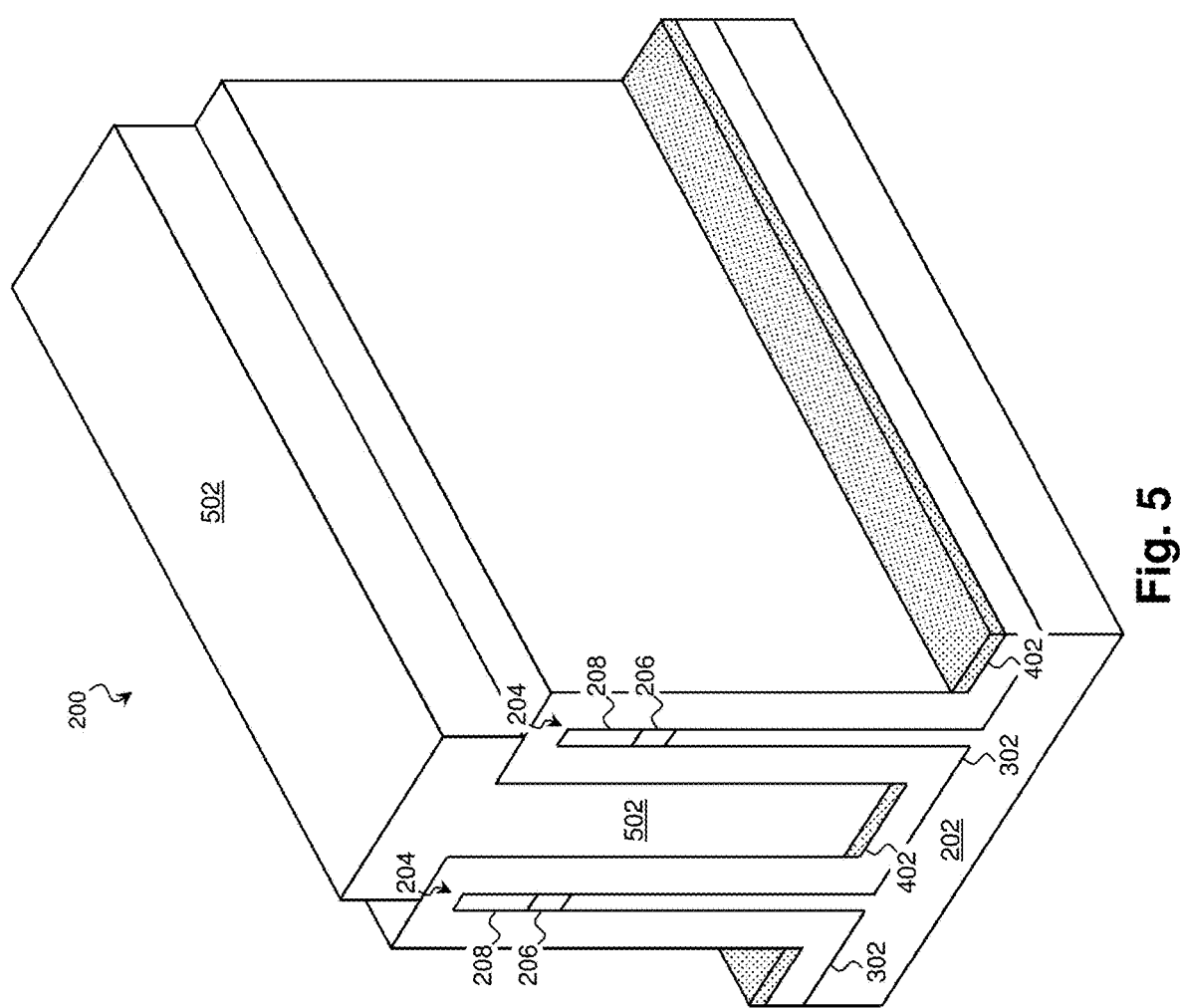

Referring to block 108 of FIG. 1A and to FIG. 5, a patterned photoresist 502 is formed on the workpiece 200 that covers and protects the seed layer 402 where buried interconnect conductors are to be formed. An exemplary photoresist 502 includes a photosensitive material that is sensitive to radiation such as UV light, deep ultraviolet (DUV) radiation, and/or EUV radiation. Accordingly, a lithographic process is performed by exposing selected regions of the photoresist 502 to radiation. In one embodiment, a photolithographic system exposes the photoresist 502 to radiation in a particular pattern determined by a mask. Light passing through or reflecting off the mask strikes the photoresist 502 thereby transferring a pattern formed on the mask to the photoresist 502. In other such embodiments, the photoresist 502 is exposed using a direct write or maskless lithographic technique, such as laser patterning, e-beam patterning, and/or ion-beam patterning. Once exposed, the photoresist 502 is developed, leaving the exposed portions of the resist, or in alternative examples, leaving the unexposed portions of the resist. An exemplary patterning process includes soft baking of the photoresist 502, mask aligning, exposure, post-exposure baking, developing the photoresist 502, rinsing, and drying (e.g., hard baking).

Figure 6:
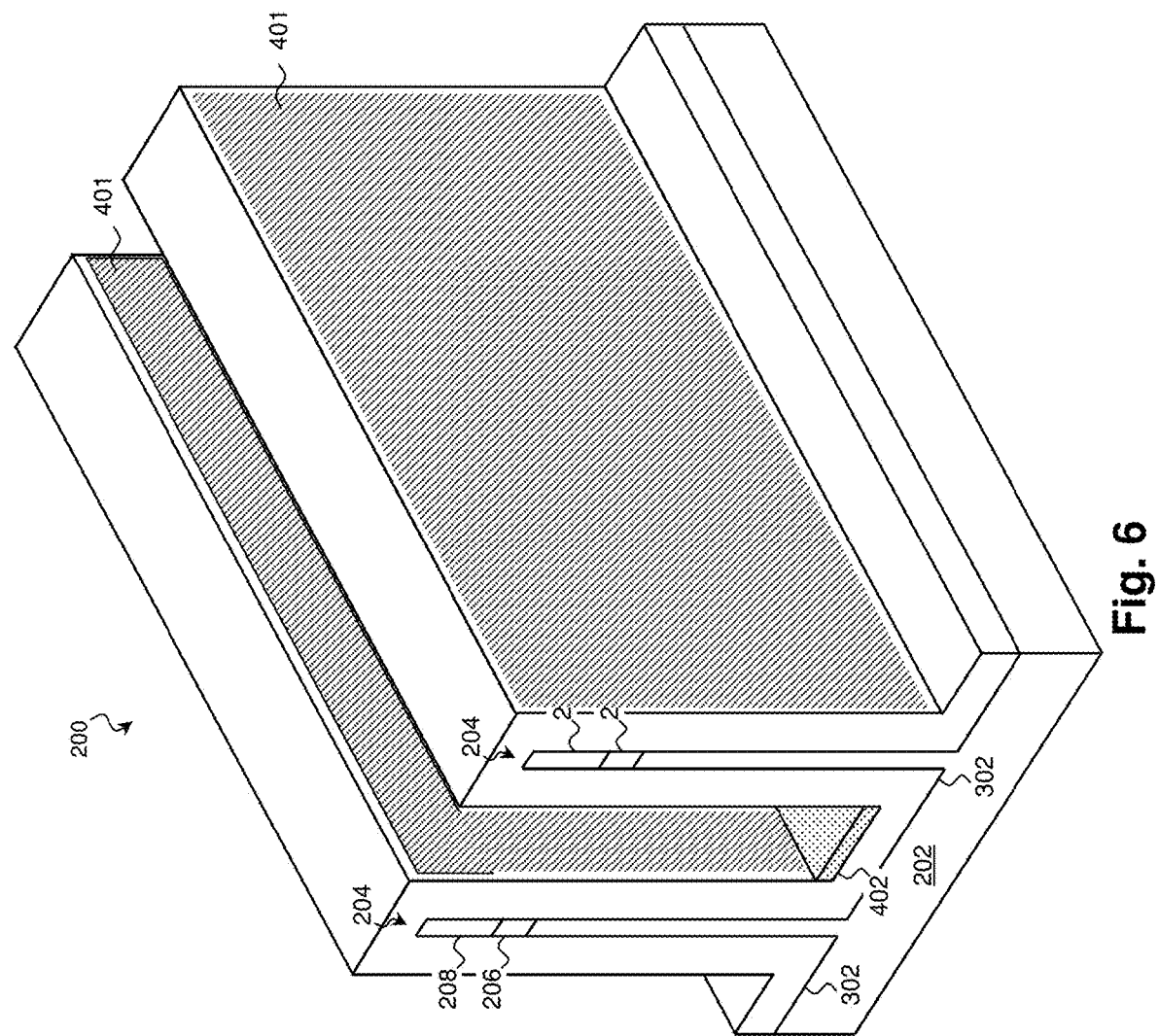

Referring to block 110 of FIG. 1A and to FIG. 6, the portions of the seed layer 402 that are exposed by the photoresist 502 are removed to avoid forming buried interconnect conductors in these locations. In various examples, seed layer 402 is removed by an etching technique such as wet etching, dry etching, Reactive Ion Etching (RIE), ashing, and/or other etching methods. After etching the seed layer 402, any remaining photoresist 502 may be removed. In some embodiments, a liner or barrier layer 401 may be optionally formed on sidewalls of the spacer layer 302 by conformally depositing a liner/barrier layer material over the spacer layer 302 and the seed layer 402, and then anisotropically etching back the liner/barrier layer material deposited on top-facing surfaces of the spacer layer 302 and the seed layer 402. In some instances, the optional liner/barrier layer 401 may protect metal materials (such as the metal materials used to form the buried interconnect conductor 702, to be described below) from oxidation due to physical contact with the spacer layer 302.

Figure 7:
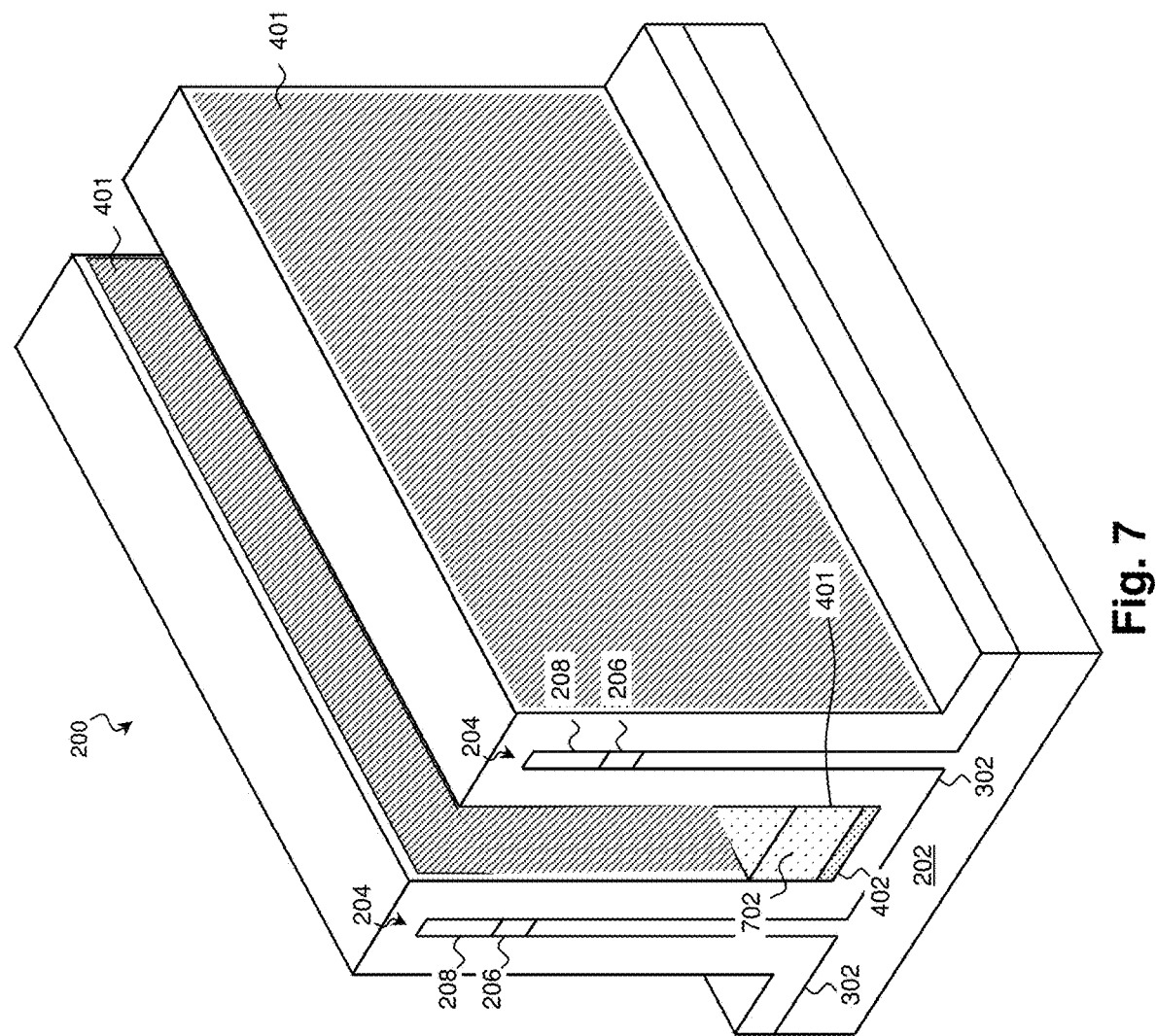

Referring to block 112 of FIG. 1A and to FIG. 7, a buried interconnect conductor 702 is formed. The buried interconnect conductor 702 may be used to form signal lines, power/ground rails, and other conductive features that are typically part of an integrated circuit interconnect. In some examples, the buried interconnect conductor 702 is selectively deposited on the seed layer 402 so that it is formed within those gaps where the seed layer 402 is present without being formed elsewhere on the workpiece 200. In particular, the buried interconnect conductor 702 is configured to bond to the material of the seed layer 402 without bonding to other materials such as the spacer layer 302. The buried interconnect conductor 702 may be deposited by any suitable selective deposition process including vapor deposition, CVD, PECVD, HDP-CVD, ALD, PEALD, and/or other suitable techniques. The buried interconnect conductor 702 may be formed to any suitable height and width. In various examples, the height is between about 20 nm and about 60 nm and the width is between about 20 and about 40 nm. In some such examples, an aspect ratio (the ratio of width to height) of the buried interconnect conductor 702 is between about 2:1 and about 1:3. In some such examples, the height of the buried interconnect conductor 702 is such that the entirety of the interconnect conductor 702 is below the circuit devices subsequently formed on the fins. As illustrated in FIG. 7, in embodiments where the optional liner/barrier layer 401 is formed on sidewalls of the spacer layer 302, the liner/barrier layer 401 may prevent oxygen in the spacer layer 302 from diffusing into the buried interconnect conductor 702. The liner/barrier 401 is also illustrated in FIGS. 9-19 but no description thereof will be repeated with respect to each figure.

The buried interconnect conductor 702 may include any suitable conductive material, such as metals, metal oxides, metal nitrides, other suitable conductors, and/or combinations thereof, and in some examples, the buried interconnect conductor 702 includes tungsten and/or ruthenium.

Figure 8:
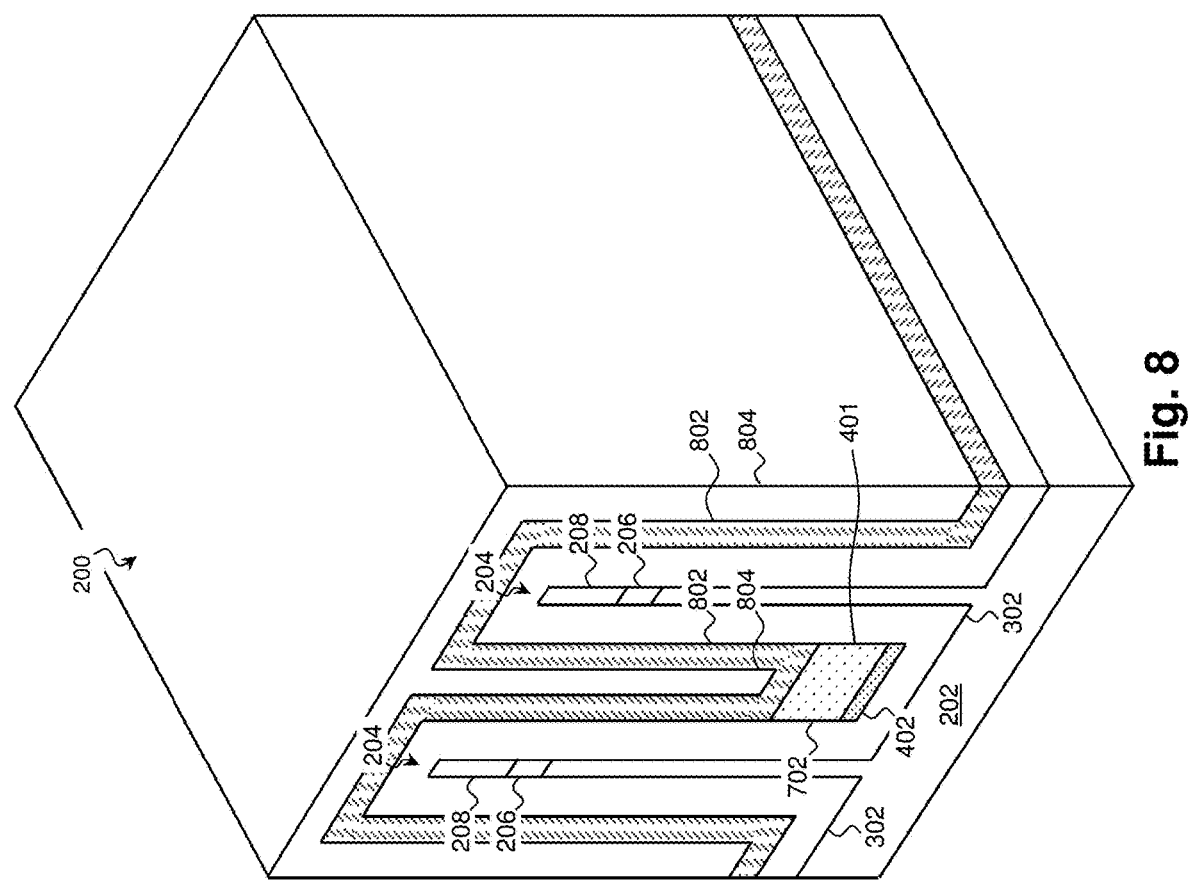

Referring to block 114 of FIG. 1 and to FIG. 8, one or more dielectric capping layers (e.g., layers 802 and 804) are deposited on the workpiece 200 and specifically on the buried interconnect conductor 702. The dielectric capping layers 802 and 804 may include any suitable dielectric materials (e.g., semiconductor oxides, semiconductor nitrides, semiconductor oxynitrides, semiconductor carbides, other suitable insulator materials, and/or combinations thereof) and may be similar in composition or different from each other. Dielectric materials are commonly characterized by their dielectric constant relative to silicon dioxide, and the dielectric capping layers 802 and 804 may include high-k and/or low-k materials. In some such embodiments, the first dielectric capping layer 802 includes a low-k dielectric material, such as SiCN, SiOC, SiOCN, and/or other suitable low-k dielectric materials, and the second dielectric capping layer 804 includes a high-k dielectric material, such as $HfO_2$, HfSiO, HfSiON, HfTaO, HfTiO, HfZrO, zirconium oxide (e.g., $ZrO_2$), aluminum oxide (e.g., $Al_2O_3$), hafnium dioxide-alumina ($HfO_2$—$Al_2O_3$) alloy, and/or other suitable high-k dielectric materials. In embodiments with multiple dielectric capping layers 802 and 804 with different materials, the materials may be selected to have different etch selectivity.

The dielectric capping layers 802 and 804 may be formed to any suitable thickness provided that the layers collectively fill the recesses between the fins 204. In an example, each of the first dielectric capping layer 802 and the second dielectric capping layer 804 has a thickness between about 5 nm and about 30 nm.

Figure 9:
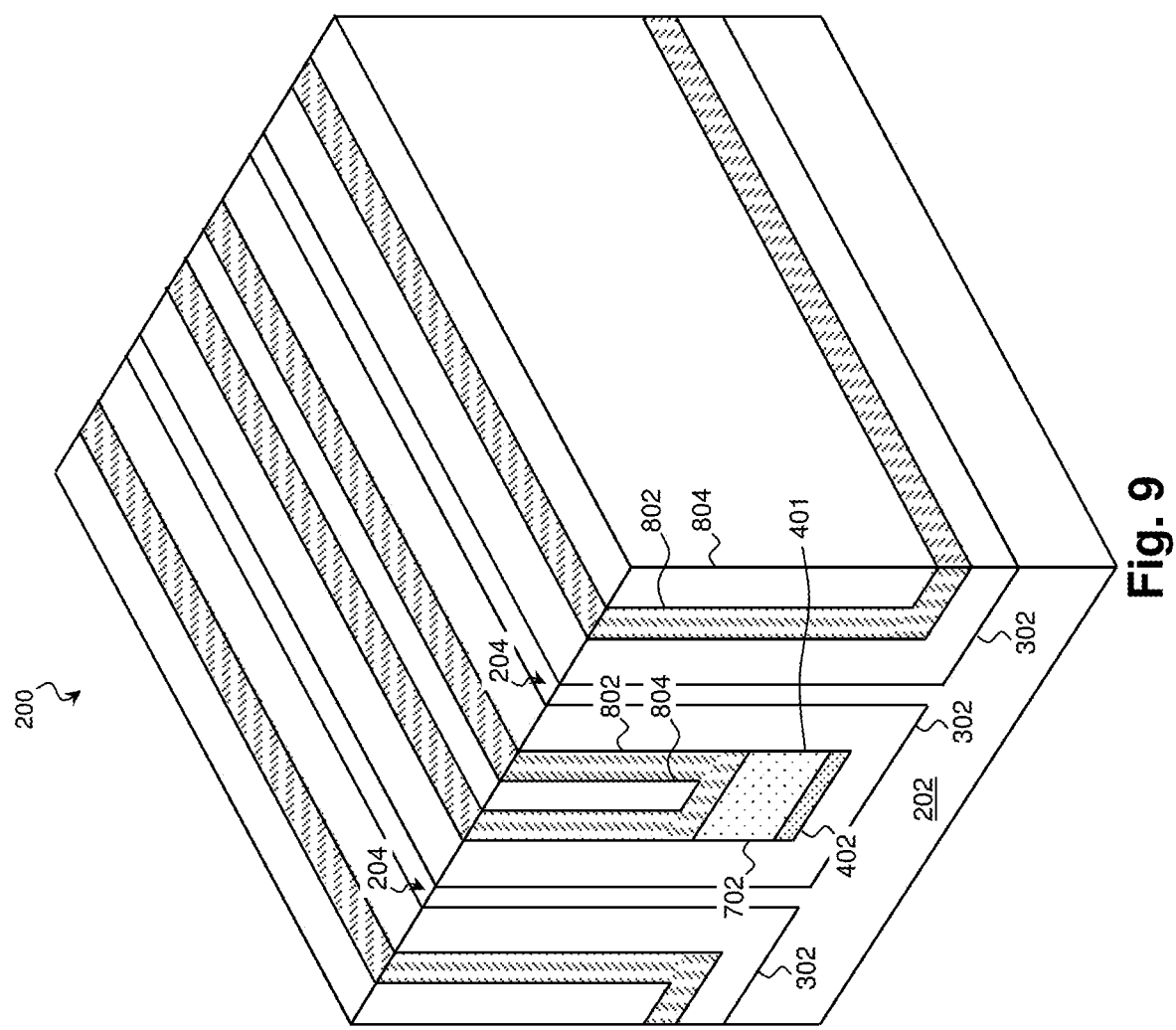

Referring to block 116 of FIG. 1A and to FIG. 9, a Chemical Mechanical Polishing/Planarization (CMP) process is performed on the workpiece 200. The CMP process may remove the fin-top hard masks 206 and 208 from the fins 204 and create a planar surface that includes top surfaces of the fins 204, the spacer layer 302, and the dielectric capping layers 802 and 804.

Figure 10:
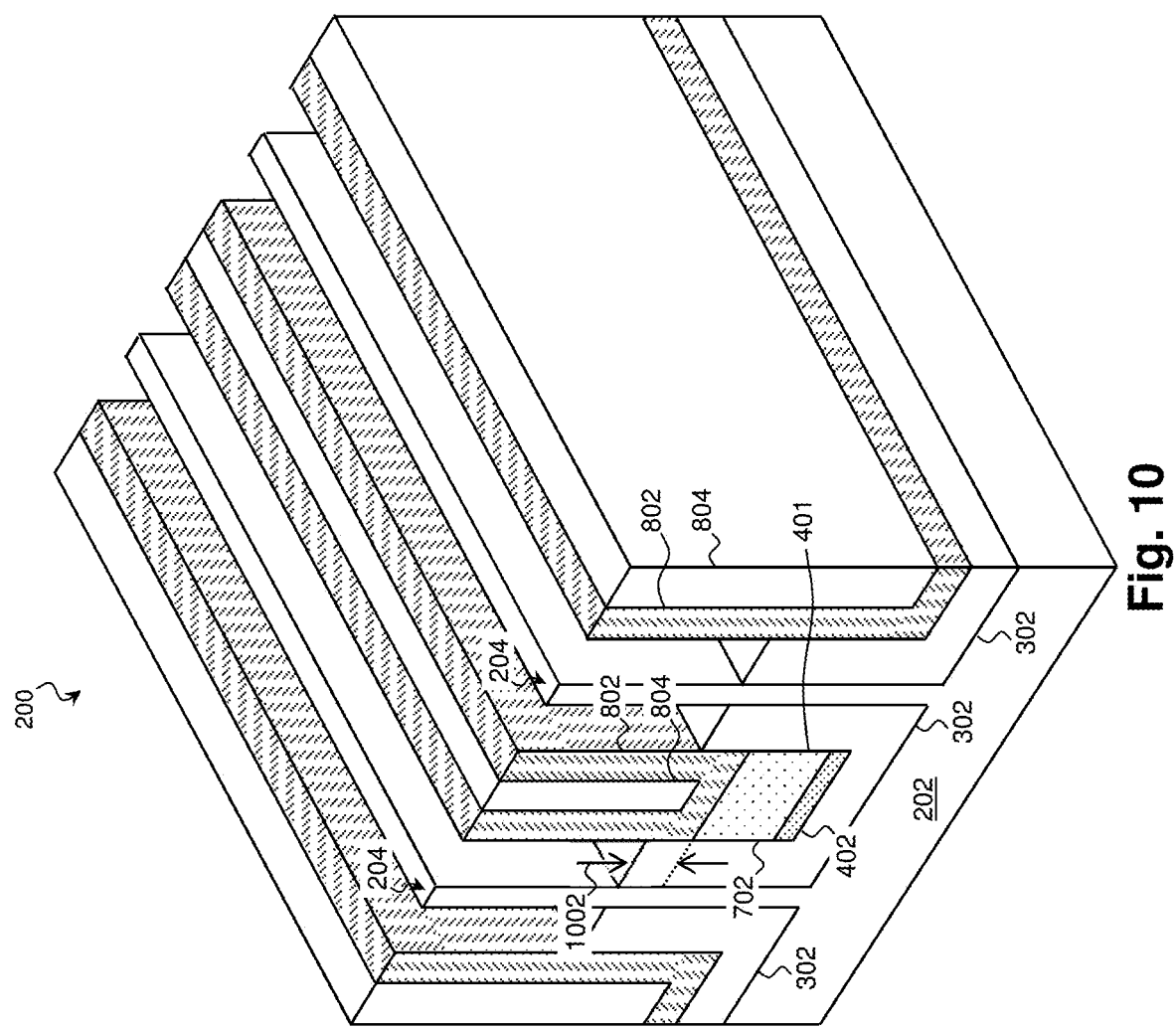

Referring to block 118 of FIG. 1A and to FIG. 10, the spacer layer 302 is etched back such that the fins 204 extend above the remaining spacer layer 302. In this way, the remaining spacer layer 302 may form isolation features such as shallow trench isolation features (STIs) disposed between the fins 204. In various examples, the fins 204 extend between about 100 nm and about 500 nm above the topmost surface of the remaining spacer layer 302. As can be seen in FIG. 10, the top surface of the spacer layer 302 is above the top of the buried interconnect conductor 702. In various examples, the top surface of the spacer layer extends between about 10 nm and about 50 nm above the top surface of the buried interconnect conductor 702 as indicated by marker 1002.

Figure 11:
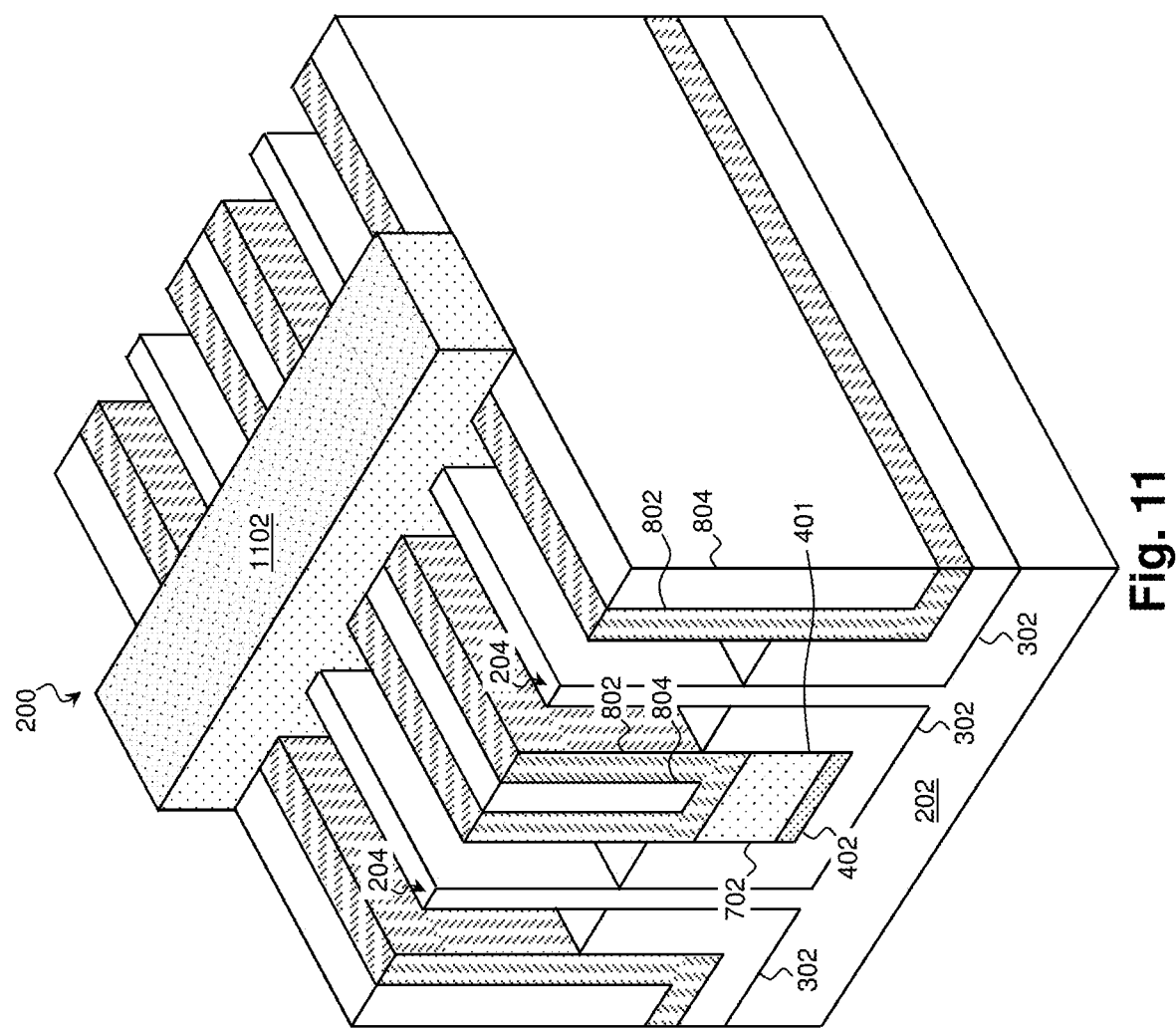

Referring to block 120 of FIG. 1A and to FIG. 11, placeholder gates 1102 are formed over channel regions of the fins 204. In more detail, the flow of carriers (electrons for an n-channel FinFET and holes for a p-channel FinFET) between source/drain features through a channel region is controlled by a voltage applied to a gate structure that is adjacent to and overwrapping the channel region. When materials of the gate structure are sensitive to some fabrication processes, such as source/drain activation annealing, or are difficult to pattern, a placeholder gate 1102 may be used during some of the fabrication processes and subsequently removed and replaced with elements of a functional gate (e.g., a gate electrode, a gate dielectric layer, an interfacial layer, etc.) in a gate-last process.

Referring to block 122 of FIG. 1A and to FIG. 12, sidewall spacers 1202 are formed on the sidewalls of the placeholder gates 1102 and of the fins 204 in the source/drain regions. The sidewall spacers 1202 may be used to offset the subsequently formed source/drain features and may be used for designing or modifying the source/drain structure (junction) profile. The sidewall spacers 1202 may include any suitable dielectric material, such as a semiconductor oxide, a semiconductor nitride, a semiconductor carbide, a semiconductor oxynitride, other suitable materials, and/or combinations thereof. In some examples, the sidewall spacers 1202 include multiple layers of different dielectric materials (e.g., a semiconductor oxide layer on a semiconductor nitride layer, etc.)

Referring to block 124 of FIG. 1B and to FIG. 13, an epitaxial process is performed to form source/drain features 1302 in the source/drain regions of the fins 204. The placeholder gates 1102 and/or the sidewall spacers 1202 limit the source/drain features 1302 to the source/drain regions. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fins 204. In some implementations illustrated in FIG. 13 where the source/drain features 1302 is adjacent to or in contact with the first dielectric capping layer 802, air gaps 1401 with a triangular cross-section may be formed underneath edges of the source/drain features 1302, as no material may have access to these air gaps.

The source/drain features 1302 may be in-situ doped during the epitaxy process by introducing doping species including: p-type dopants, such as boron or $BF_2$; n-type dopants, such as phosphorus or arsenic; and/or other suitable dopants including combinations thereof. If the source/drain features 1302 are not in-situ doped, an implantation process (i.e., a junction implant process) is performed to dope the source/drain features 1302. In an exemplary embodiment, the source/drain features 1302 in an NMOS device include SiP, while those in a PMOS device include GeSnB (tin may be used to tune the lattice constant) and/or SiGeSnB. One or more annealing processes may be performed to activate the source/drain features 1302. Suitable annealing processes include rapid thermal annealing (RTA) and/or laser annealing processes.

In some examples, portions of the fins 204 and/or the sidewall spacers 1202 are recessed prior to the performing of the epitaxial process of block 124 to control the particular profile of the source/drain features 1302. In some such examples, the profile of the source/drain features 1302 is such that the entirety of the buried interconnect conductor 702 is below the source/drain features 1302.

Figure 14:
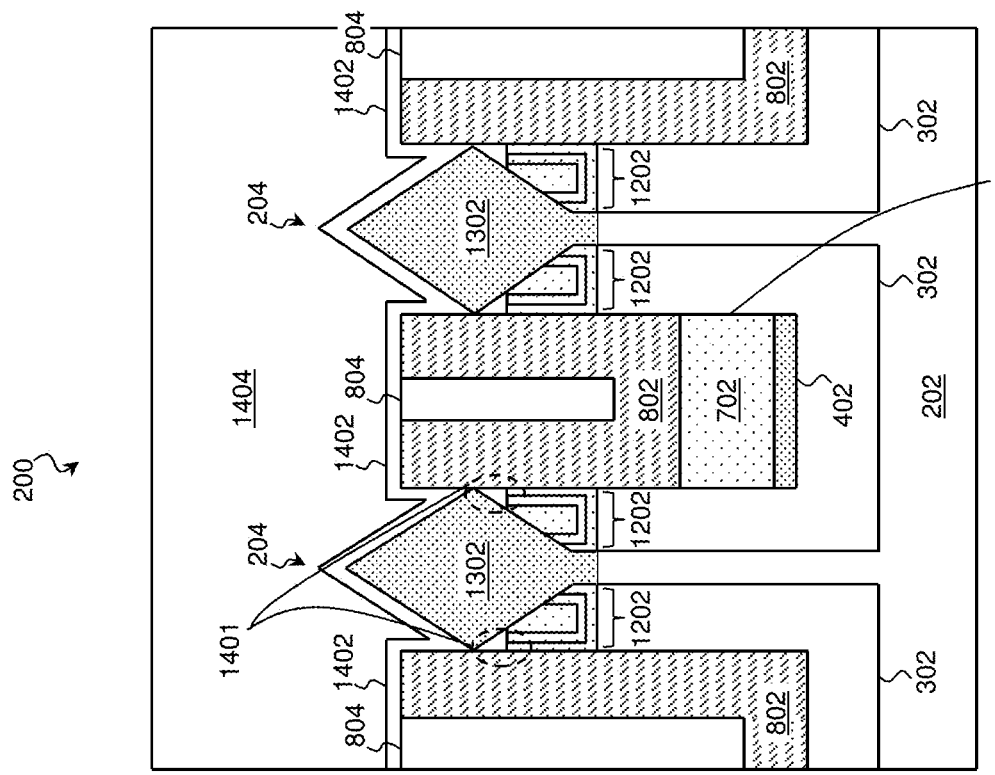

Referring to block 126 of FIG. 1B and to FIG. 14, a contact-etch stop layer (CESL) 1402 is formed on the source/drain features 1302. The CESL 1402 protects underlying structures from etching damage when etching overlying materials such as a subsequent Inter-Level Dielectric (ILD) layer. The CESL 1402 may include a dielectric (e.g., a semiconductor oxide, a semiconductor nitride, a semiconductor oxynitride, a semiconductor carbide, etc.) and/or other suitable material, and in various embodiments, the CESL 1402 includes SiN, SiO, SiON, and/or SiC. The CESL 1402 may be deposited by any suitable technique including ALD, PEALD, CVD, PECVD, and/or HDP-CVD and may be formed to any suitable thickness. In some examples, the CESL 1402 has a thickness between about 1 nm and about 50 nm. The air gaps 1401 described in reference to FIG. 13 are also present in FIG. 14 at block 126.

Referring to block 128 of FIG. 1B and referring still to FIG. 14, an Inter-Level Dielectric (ILD) layer 1404 is formed on the workpiece 200. The ILD layer 1404 acts as an insulator that supports and isolates conductive traces of an electrical multi-level interconnect structure. In turn, the multi-level interconnect structure electrically interconnects elements of the workpiece 200, such as the source/drain features 1302 and the functional gates. The ILD layer 1404 may include a dielectric material (e.g., a semiconductor oxide, a semiconductor nitride, a semiconductor oxynitride, a semiconductor carbide, etc.), SOG, fluoride-doped silicate glass (FSG), phosphosilicate glass (PSG), borophosphosilicate glass (BPSG), Black Diamond® (Applied Materials of Santa Clara, California), Xerogel, Aerogel, amorphous fluorinated carbon, parylene, BCB, SiLK® (Dow Chemical of Midland, Michigan), and/or combinations thereof. The ILD layer 1404 may be formed by any suitable process including CVD, PVD, spin-on deposition, and/or other suitable processes.

Referring to block 130 of FIG. 1B and to FIG. 15, which is a cross-section through the gate region, a gate replacement process is performed to replace the placeholder gates 1102 with functional gates 1502. In some examples, the gate replacement process includes an etching process (e.g., wet etching, dry etching, RIE, etc.) configured to remove material of the placeholder gates 1102 without substantial etching of the ILD layer 1404, the sidewall spacers 1202, or other materials of the workpiece 200.

Removing the placeholder gates 1102 leaves recesses in which to form functional gates 1502. In some examples, the gate replacement process deposits an interfacial layer of the functional gates 1502 in the recesses. The interfacial layer 1504 may include an interfacial material, such as a semiconductor oxide, semiconductor nitride, semiconductor oxynitride, other semiconductor dielectrics, other suitable interfacial materials, and/or combinations thereof. The interfacial layer 1504 may be formed to any suitable thickness using any suitable process including thermal growth, ALD, CVD, HDP-CVD, PVD, spin-on deposition, and/or other suitable deposition processes. In some examples, the interfacial layer 1504 is formed by a thermal oxidation process and includes a thermal oxide of a semiconductor present in the fins 204 (e.g., silicon oxide for silicon-containing fins 204, silicon-germanium oxide for silicon-germanium-containing fins 204, etc.).

In some examples, the gate replacement process forms a gate dielectric 1506 on the interfacial layer 1504 on the side surfaces of the fins 204 and on the top of the fins 204. In some embodiments, the gate dielectric 1506 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1506 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 1506 may be formed using any suitable process including ALD, PEALD, CVD, Plasma Enhanced CVD (PE CVD), HDP-CVD, PVD, spin-on deposition, and/or other suitable deposition processes. The gate dielectric 1506 may be formed to any suitable thickness, and in some examples, the gate dielectric 1506 has a thickness between about 0.1 nm and about 3 nm.

In some examples, the gate replacement process forms one or more work function layers 1508 of the functional gates 1502 on the gate dielectric 1506. Suitable work function layer materials include n-type and/or p-type work function materials based on the type of device. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) 1208 may be deposited by any suitable technique including ALD, CVD, PE CVD, PEALD, PVD, and/or combinations thereof.

In some examples, the gate replacement process forms an electrode fill 1510 of the functional gates 1502 on the work function layer(s) 1508. The electrode fill 1510 may include any suitable material including metals (e.g., W, Al, Ta, Ti, Ni, Cu, Co, etc.), metal oxides, metal nitrides and/or combinations thereof, and in an example, the electrode fill includes tungsten. The electrode fill 1510 may be deposited by any suitable technique including ALD, CVD, PE CVD, PEALD, PVD, and/or combinations thereof.

A CMP process may be performed to remove excess gate material (e.g., material of: the gate dielectric 1506, the work function layer(s) 1508, the electrode fill 1510, etc.) that is outside of the functional gates 1502.

Contacts may then be formed that extend to the source/drain features 1302 and to the buried interconnect conductor 702. Referring to block 132 of FIG. 1B and to FIG. 16, the ILD layer 1404 and the CESL 1402 are selectively removed from the source/drain features 1302 where source/drain contacts are to be formed. In an example, a photoresist is formed on the workpiece 200, and a lithographic exposure is performed that exposes selected regions of the photoresist to radiation. After exposure, a developer is applied to the photoresist to remove the portions of the photoresist from over the ILD layer 1404 in locations where a source/drain contact is to couple to a source/drain feature 1302. After the photoresist is developed, exposed portions of the ILD layer 1404 may be removed by an etching process, such as wet etching, dry etching, RIE, ashing, and/or other etching methods. In various examples, the etching process includes one or more anisotropic (directional) etching processes configured to etch faster in a vertical direction than a horizontal direction using one or more etchants configured to selectively etch the ILD layer 1404. The photoresist may be removed after the etching process completes. In the illustrated embodiments, the process of block 132 also removes the ILD layer 1404 and the CESL 1402 in a region of the workpiece 200 where a contact is to extend to the buried interconnect conductor 702. The etching of block 132 may etch some of the first dielectric capping layer 802 without substantial etching of the second dielectric capping layer 804. The air gaps 1401 described in reference to FIG. 13 are also present in FIG. 16 at block 132.

Additional etching of the first dielectric capping layer 802 may be performed to further expose the buried interconnect conductor 702. Referring to block 134 of FIG. 1B and to FIG. 17, another photoresist 1702 material is formed and patterned to expose the first dielectric capping layer 802 where the contact to the buried interconnect conductor 702 is to be formed. In some examples, this includes performing a lithographic exposure on the photoresist 1702 to expose selected regions of the photoresist 1702 to radiation. After exposure, a developer is applied to the photoresist 1702 to selectively remove the exposed or unexposed portions of the photoresist 1702. The air gaps 1401 described in reference to FIG. 13 are also present in FIG. 17 at block 134.

Referring to block 136 of FIG. 1B and to FIG. 18, an etching process is performed on the first dielectric capping layer 802 to form a contact recess (or recess) that exposes the buried interconnect conductor 702. The etching process may use any suitable etching technique (e.g., wet etching, dry etching, RIE, etc.), and by selecting an appropriate technique and etchant, the first dielectric capping layer 802 can be etched without significant etching of the surrounding materials. In this way, the recess formed by the etching is self-aligned and spaced away from the adjacent fins 204 by the spacer layer 302 and the second dielectric capping layer 804. This may allow more overlay error (i.e., relax the overlay error limits) when patterning the photoresist 1702 and thereby improve manufacturability and yield. While the air gaps 1401 described in reference to FIG. 13 are still present in FIG. 18 at block 136, at least some of the air gaps 1401 may be opened up by the etching process at block 136.

Because the resistance of an interface is inversely proportional to the interface area, the etching of block 136 may undercut the second dielectric capping layer 804 and thereby increase the interface area and reduce resistance at the contact interface. In some examples, an anisotropic etching technique is used that completely undercuts the second dielectric capping layer 804 to etch some of the first dielectric capping layer 802 on either side.

Referring to block 138 of FIG. 1B and to FIG. 19, silicide features 1902 are formed on the source/drain features 1302 where source/drain contacts are to be formed. The silicide features 1902 may reduce the resistance at the interface between the source/drain features 1302 and the source/drain contacts and may include a metal and a semiconductor material of the source/drain features 1302. While some of the air gaps 1401 described in reference to FIG. 18 are still present in FIG. 19 at block 138, some of the air gaps 1401 that are opened up by the etching process at block 136 may provide access to the area underneath the edge of some of the source/drain features 1302 and allow the silicide feature 1902 to be formed underneath some of the source/drain features 1302, removing some of the air gaps 1401.

Referring to block 140 of FIG. 1B and to FIG. 19, a contact liner 1904 for the source/drain contacts is formed. The contact liner 1904 may promote adhesion between a contact fill material and a remainder of the workpiece 200 and may act a barrier that prevents the fill material from diffusing into the workpiece 200. Accordingly, the contact liner 1904 may include any suitable conductive material including metals (e.g., Ti, Ta, Co, W, Al, Ni, Cu, Co, etc.), metal nitrides, metal silicon nitrides, and/or other suitable materials. In one such embodiment, the contact liner 1904 includes TiN. The contact liner 1904 may have any suitable thickness, and in some examples is between about 1 nm and about 5 nm thick.

The processes of blocks 138 and 140 may be performed separately or together. In an example of forming the silicide features 1902 and the contact liner 1904 concurrently, a metal-containing precursor is deposited using ALD, PEALD, CVD, PECVD, HDP-CVD, and/or other suitable deposition processes. In particular, the technique may be configured to deposit the precursor within the portion of the contact recess that undercuts the second dielectric capping layer 804. The precursor may be formed to any suitable thickness and, in various examples, is formed by a CVD process to have a thickness between about 1 nm and about 5 nm. The workpiece 200 is annealed to convert the precursor into the contact liner 1904. In so doing, the annealing process may introduce nitrogen into the contact liner 1904 from ambient $N_2$ and/or $NH_3$ present during the annealing. In an example, the annealing converts a precursor that is predominantly Ti into a contact liner 1904 that includes TiN. In the example, the annealing process also causes the metal to diffuse from the precursor into an outer region of the source/drain feature 1302 to form the silicide feature 1902 on the remaining source/drain feature 1302.

Referring to block 142 of FIG. 1B and referring still FIG. 19, a contact fill 1906 is deposited on the workpiece 200 including on the contact liner 1904 to define source/drain contacts that include the contact liner 1904 and the contact fill 1906. The contact fill 1906 may be deposited by any suitable technique including ALD, PEALD, CVD, PE CVD, Physical Vapor Deposition (PVD), and/or combinations thereof. The contact fill 1906 may include any suitable material including metals (e.g., Co, W, Al, Ta, Ti, Ni, Cu, etc.), metal oxides, metal nitrides and/or combinations thereof, and in an example, the contact fill 1906 includes cobalt.

As can be seen, a contact (e.g., contact liner 1904 and contact fill 1906) may extend from a source/drain feature 1302 to the buried interconnect conductor 702 to electrically couple them. Furthermore, to reduce resistance at the interface with the buried interconnect conductor 702, the contact may undercut the second dielectric capping layer 804. In some example, the contact undercuts the second dielectric capping layer 804 completely to couple to the interconnect conductor 702 on either side of the second dielectric capping layer 804 as shown. The contact may be generally referred to as a conductive feature for its electrically conductive property. In the embodiment illustrated in FIG. 19, the contact extends from a level above a top surface of the source/drain feature 1302 to a level below a bottom surface of the source/drain feature 1302. As such, the contact illustrated in FIG. 19 is different from conventional source/drain contacts that are formed over the source/drain features and do not extend below bottom surfaces of the source/drain features.

A Chemical Mechanical Planarization/Polishing (CMP) process may be performed following the deposition of the contact fill 1906 to planarize the ILD layer 1404, the contact liner 1904, and the contact fill 1906.

Referring to block 144 of FIG. 1B and to FIG. 19, the workpiece 200 may be provided for further fabrication. This may include forming a remainder of an electrical interconnect structure, dicing, packaging, and other fabrication processes. In an example, this includes: recessing the contact liner 1904 and the contact fill 1906; forming a Self-Aligned Contact (SAC) dielectric layer 1908 on the ILD layer 1404, the contact liner 1904, and the contact fill 1906; forming a second set of contacts 1910 electrically coupling to the source/drain contacts (contact liner 1904 and contact fill 1906) and to the functional gates 1502; forming additional ILD layers 1912 substantially similar to ILD layer 1404; and forming conductive features 1914, including conductive lines and vias, in the ILD layers 1912.

Figure 20:
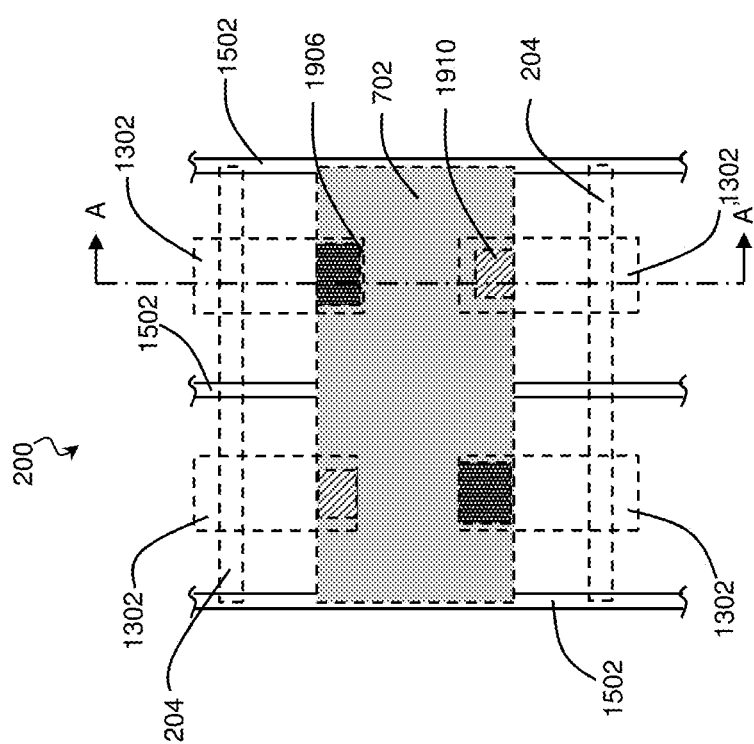
FIG. 20 is a top-view illustration of the workpiece illustrated in FIG. 19, according to various aspects of the present disclosure.

Reference is now made to FIG. 20, which is a partial top-view illustration of the workpiece 200 in FIG. 19. In some embodiments represented in FIG. 20, length-wise, interconnect conductor 702 extend parallel to and between fins 204. In addition, in these embodiments, also along the lengthwise direction, the interconnect conductor 702 may extend under more than one functional gates 1502. Widthwise, the interconnect conductor 702 according to these embodiments of the present application extends between one source/drain feature 1302 and another, with some of the source/drain features 1302 electrically coupled to the interconnect conductor 702 via the contact fill 1906 (or the contact, which also includes the contact liner 1904) and some of them electrically coupled to overlying interconnect structures via one of the second set of contacts 1910. FIG. 19 is a cross-sectional view of the workpiece 200 in FIG. 20 along section A-A'.

Accordingly, an integrated circuit with a buried interconnect conductor and a method for forming the integrated circuit are described herein. In some embodiments, a method of forming a semiconductor device includes forming a fin element extending from a substrate. A seed layer is deposited adjacent to the fin element, and a first metal layer is selectively formed over the seed layer. A set of dielectric capping layers is deposited over the semiconductor device including over the first metal layer. A source/drain region is formed over an end of the fin element, and a second metal layer is formed in contact with both the epitaxial source/drain region and the first metal layer. In some such embodiments, the first metal layer is below the source/drain region. In some such embodiments, a dielectric layer is formed adjacent to the fin element prior to the depositing of the seed layer so that the dielectric layer is disposed between the fin element and the first metal layer. In some such embodiments, the dielectric layer is further disposed between the fin element and the second metal layer. In some such embodiments, the set of dielectric capping layers includes a first dielectric capping layer and a second dielectric capping layer. The forming of the second metal layer includes etching a contact recess by selectively etching the first dielectric capping layer. In some such embodiments, the first dielectric capping layer includes a low-k dielectric material, and the second dielectric capping layer includes a high-k dielectric material. In some such embodiments, the low-k dielectric material includes at least one material from a group consisting of: SiCN, SiOC, and SiOCN, and the high-k dielectric material includes at least one material from a group consisting of $HfO_2$, $ZrO_2$, and $Al_2O_3$. In some such embodiments, the first metal layer defines a buried power rail.

In further embodiments, a method includes receiving a substrate that includes a plurality of fins extending from a remainder of the substrate. A spacer layer is formed between the plurality of fins, and a buried interconnect conductor is formed on the spacer layer between the plurality of fins. A set of capping layers is formed on the buried interconnect conductor between the plurality of fins. A contact recess is etched through the set of capping layers that exposes the buried interconnect conductor, and a contact is formed in the contact recess that is electrically coupled to the buried interconnect conductor. In some such embodiments, the etching of the contact recess is configured to selectively etch a first capping layer of the set of capping layers. In some such embodiments, the selective etching of the first capping layer undercuts a second capping layer of the set of capping layers such that portions of the first capping layer underneath and on either side of the second capping layer are removed. In some such embodiments, the etching of the contact recess is self-aligned by the spacer layer. In some such embodiments, the spacer layer is disposed between a first fin of the plurality of fins and the buried interconnect conductor and between the first fin and the contact. In some such embodiments, the forming of the buried interconnect conductor includes forming a seed layer on the spacer layer between the plurality of fins, and selectively depositing the buried interconnect conductor on the seed layer. In some such embodiments, the seed layer includes amorphous silicon.

In further embodiments, an integrated circuit device includes a substrate that includes a plurality of fins. A first fin of the plurality of fins includes a source/drain feature. The integrated circuit device further includes: a spacer layer disposed between the plurality of fins, an interconnect conductor disposed between the plurality of fins such that the interconnect conductor is below the source/drain feature and such that the spacer layer separates the interconnect conductor from the first fin, a set of capping layers disposed on the interconnect conductor and a contact coupled to the source/drain feature, wherein the contact extends through the set of capping layers to couple to the interconnect conductor. In some such embodiments, the set of capping layers includes a first capping layer disposed on the interconnect conductor and a second capping layer disposed on the first capping layer. In some such embodiments, the contact undercuts the second capping layer. In some such embodiments, the contact extends underneath the second capping layer to couple to the interconnect conductor on two opposing sides of the second capping layer. In some such embodiments, the first capping layer includes a low-k dielectric material and the second capping layer includes a high-k dielectric material.

It is noted that the embodiments described herein may be employed in the design and/or fabrication of any type of integrated circuit, or portion thereof, which may comprise any of a plurality of various devices and/or components such as a static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, FinFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI (PD-SOI) devices, fully-depleted SOI (FD-SOI) devices, other memory cells, or other devices as known in the art. One of ordinary skill may recognize other embodiments of semiconductor devices and/or circuits, including the design and fabrication thereof, which may benefit from aspects of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a fin element extending from a substrate;
   conformally forming a spacer layer over sidewalls of the fin element and on the substrate;

depositing a seed layer on the spacer layer and adjacent to the fin element;
selectively forming a first metal layer over the seed layer;
depositing a set of dielectric capping layers over the spacer layer and the first metal layer;
performing a planarization to expose the spacer layer;
selectively recessing the spacer layer such that the fin element rises above the spacer layer;
after the selectively recessing, forming a source/drain feature over the fin element;
depositing a contact etch stop layer (CESL) over the source/drain feature;
depositing an interlayer dielectric (ILD) layer over the CESL; and
forming a second metal layer that extends through the ILD, the CESL, and the plurality of dielectric capping layers to contact both the source/drain feature and the first metal layer.

2. The method of claim 1, wherein a top surface of the first metal layer is lower than a top surface of the spacer layer.

3. The method of claim 1, wherein, after the depositing of the set of dielectric capping layers, the set of dielectric capping layers is spaced apart from the seed layer by the first metal layer.

4. The method of claim 1, wherein the spacer layer comprises silicon oxide.

5. The method of claim 1, wherein the depositing of the set of dielectric capping layers comprises:
conformally depositing a first dielectric capping layer over the first metal layer and the spacer layer; and
depositing a second dielectric capping layer over the first dielectric capping layer,
wherein the second dielectric capping layer is spacer apart from the first metal layer and the spacer layer by the first dielectric capping layer.

6. The method of claim 5, wherein a dielectric constant of the second dielectric capping layer is greater than a dielectric constant of the first dielectric capping layer.

7. The method of claim 5,
wherein the first dielectric capping layer comprises SiCN, SiOC, or SiOCN,
wherein the second dielectric capping layer comprises $HfO_2$, HfSiO, HfSiON, HfTaO, HfTiO, HfZrO, zirconium oxide, aluminum oxide, or a hafnium dioxide-alumina alloy.

8. The method of claim 5, wherein the forming of the second metal layer includes etching a contact recess by selectively etching the first dielectric capping layer.

9. The method of claim 5, wherein, after the forming of the source/drain feature, the source/drain feature is in contact with the first dielectric capping layer.

10. The method of claim 1, wherein the first metal layer comprises a thickness between about 20 nm and about 60 nm.

11. A method, comprising:
forming a first fin element and a second fin element on a substrate, each of the first fin element and the second fin element comprising at least one fin-top hard mask;
conformally depositing a spacer layer over the first fin element, the second fin element and the substrate;
selectively forming a first metal layer on the spacer layer between the first fin element and the second fin element;
depositing a first dielectric capping layer over the first metal layer and the spacer layer;
depositing a second dielectric capping layer over the first dielectric capping layer;
planarizing the first dielectric capping layer and the second dielectric capping layer to expose the spacer layer and to remove the at least one fin-top hard mask;
selectively recessing the spacer layer;
forming a first source/drain feature over the first fin element; and
forming a second metal layer electrically coupled to the first source/drain feature and the first metal layer.

12. The method of claim 11, wherein the selectively forming the first metal layer comprises:
depositing a seed layer over the spacer layer;
forming a patterned photoresist to cover the seed layer on the spacer layer between the first fin element and the second fin element;
removing the seed layer not covered by the patterned photoresist; and
forming the first metal layer on the seed layer.

13. The method of claim 11,
wherein the first dielectric capping layer comprises SiCN, SiOC, or SiOCN,
wherein the second dielectric capping layer comprises $HfO_2$, $ZrO_2$, or $Al_2O_3$.

14. The method of claim 11, wherein the spacer layer comprises silicon oxide.

15. The method of claim 11,
wherein the forming of the second metal layer includes etching a contact recess by selectively etching the first dielectric capping layer.

16. A semiconductor structure, comprising:
a substrate;
a first fin structure and a second fin structure disposed on the substrate;
a first source/drain feature disposed on the first fin structure;
a second source/drain feature disposed on the second fin structure;
a spacer layer disposed between the first fin structure and the second fin structure and extending continuously along a sidewall of the first fin structure, a top surface of the substrate, and along a sidewall of the second fin structure;
a buried conductor disposed over the spacer layer and spaced apart from the first fin structure and the second fin structure by the spacer layer;
a dielectric feature over the buried conductor; and
a contact structure in electrical communication with a top surface of the first source/drain feature and a top surface of the buried conductor,
wherein a bottom surface of the first source/drain feature is higher than a top surface of the buried conductor.

17. The semiconductor structure of claim 16, wherein a portion of the buried conductor undercuts the dielectric feature.

18. The semiconductor structure of claim 16, further comprising:
a contact liner disposed between the contact structure and the buried conductor; and
a silicide feature disposed between the first source/drain feature and the contact structure.

19. The semiconductor structure of claim 16, wherein the dielectric feature comprises:
a first dielectric capping layer; and
a second dielectric capping layer adjacent the first dielectric capping layer,
wherein a portion of the buried conductor is disposed below the first dielectric capping layer.

20. The semiconductor structure of claim 19, disposed below the first dielectric capping layer and extend into the first dielectric capping layer.

* * * * *